(12) United States Patent
Yamashita

(10) Patent No.: US 6,864,545 B2
(45) Date of Patent: Mar. 8, 2005

(54) SEMICONDUCTOR DEVICE INCLUDING LOW-RESISTANCE WIRES ELECTRICALLY CONNECTED TO IMPURITY LAYERS

(75) Inventor: Tomohiro Yamashita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/261,509

(22) Filed: Oct. 2, 2002

(65) Prior Publication Data

US 2003/0189233 A1 Oct. 9, 2003

(30) Foreign Application Priority Data

Apr. 5, 2002 (JP) ........................................ 2002-103794

(51) Int. Cl.⁷ ........................ H01L 29/417; H01L 23/52
(52) U.S. Cl. ...................................... 257/382; 257/774
(58) Field of Search ................................ 257/382–385, 257/750–766, 774, 776

(56) References Cited

U.S. PATENT DOCUMENTS

| 4,959,812 A | * | 9/1990 | Momodomi et al. ... 365/185.17 |
| 5,677,215 A | * | 10/1997 | Goo ........................... 438/257 |
| 5,768,192 A | | 6/1998 | Eitan |
| 5,879,986 A | * | 3/1999 | Sung ........................... 438/253 |
| 6,004,843 A | * | 12/1999 | Huang ......................... 438/241 |
| 6,124,169 A | | 9/2000 | Camerlenghi et al. |
| 6,580,133 B2 | * | 6/2003 | Chan et al. ................. 257/382 |

FOREIGN PATENT DOCUMENTS

JP  8-32035  2/1996

* cited by examiner

*Primary Examiner*—Long Pham
*Assistant Examiner*—Marcos D. Pizarro-Crespo
(74) *Attorney, Agent, or Firm*—Oblon, Spivak, McClelland, Maier & Neustadt, P.C.

(57) ABSTRACT

A plurality of N-type first impurity layers (111) are provided that form stripes in a main surface (110S) of a P-type semiconductor substrate (110). At least one N-type second impurity layer (112) overlaps (or touches) one of the first impurity layers (111). A plurality of gate electrodes are provided on a gate insulating film (121). A plurality of gate electrodes form stripes crossing the first impurity layers (111). A plurality of low-resistance wires (140) are provided on an interlayer insulating film (122). The plurality of low-resistance wires (140) form stripes extending in the same direction as that of the first impurity layers (111). An end (123T2) of each contact plug (123) is entirely in contact with the second impurity layer 112, and does not touch a P-type region of the semiconductor substrate (110).

3 Claims, 23 Drawing Sheets

F I G . 1
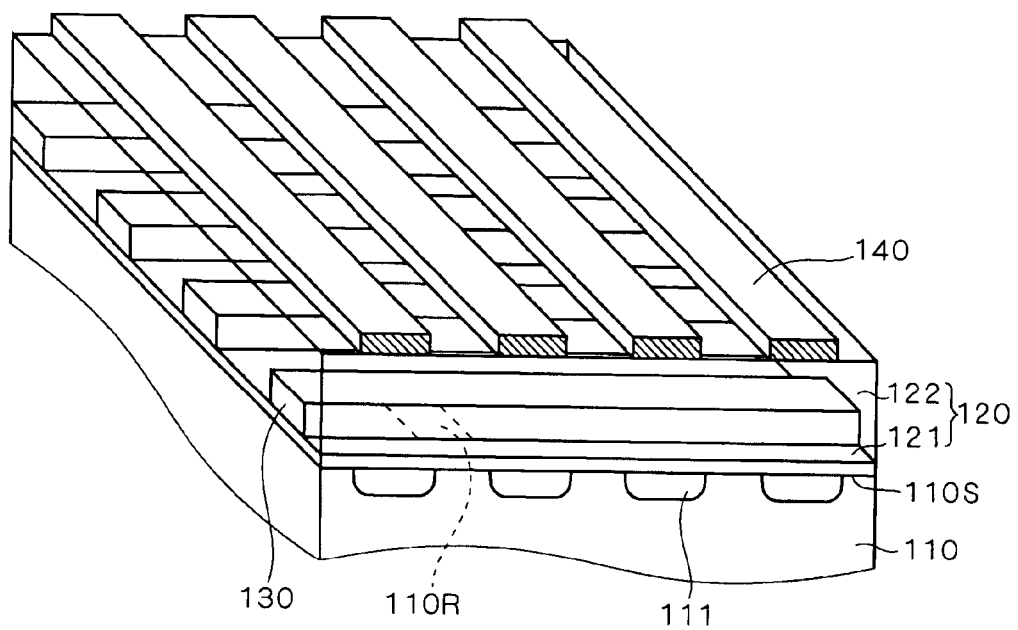

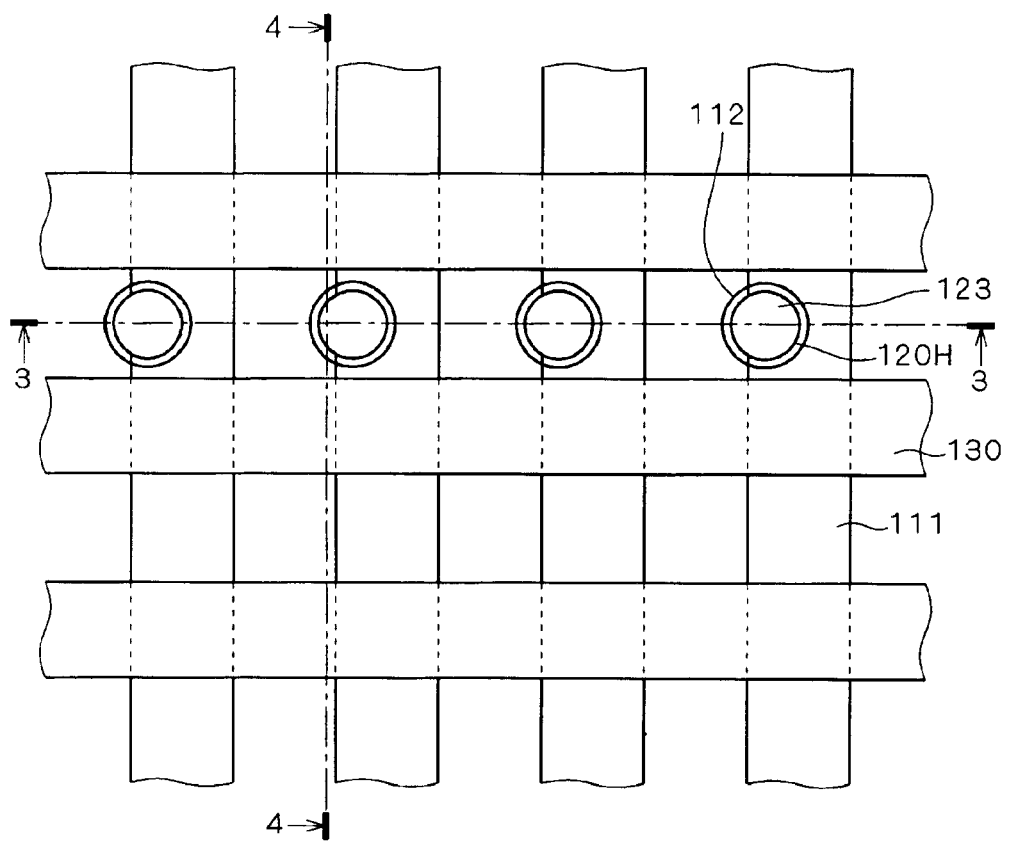
F I G . 2

F I G . 2 2
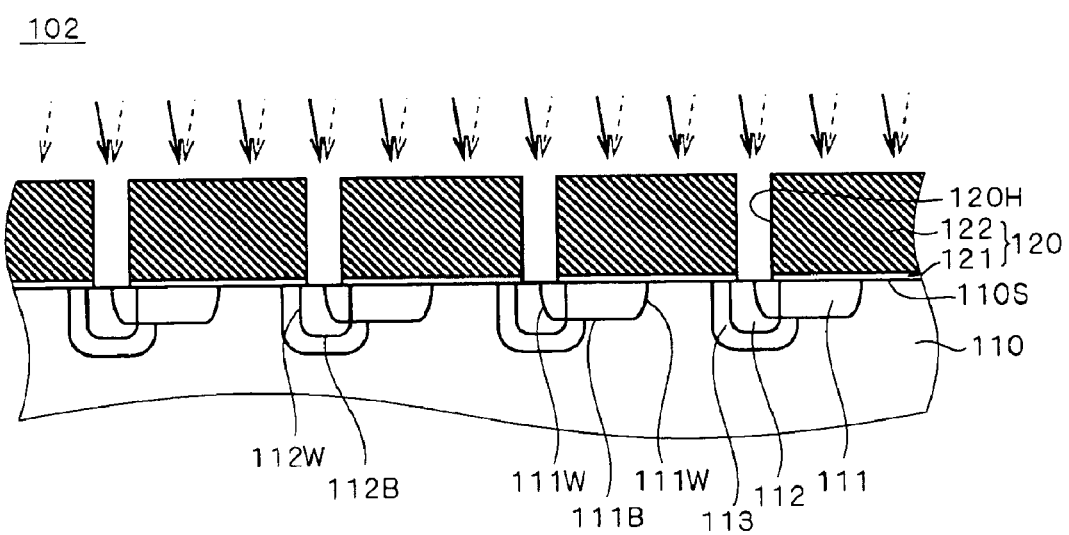

F I G . 2 6
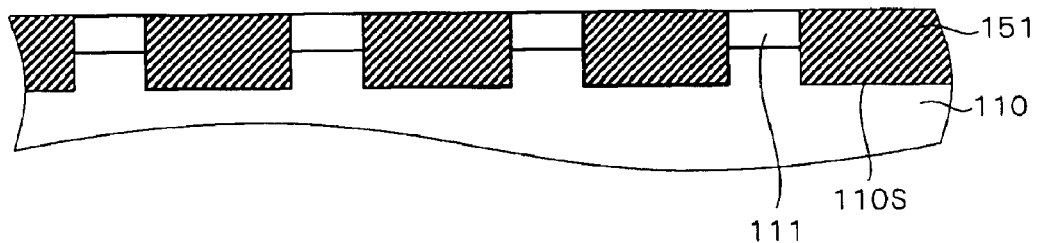
F I G . 2 7
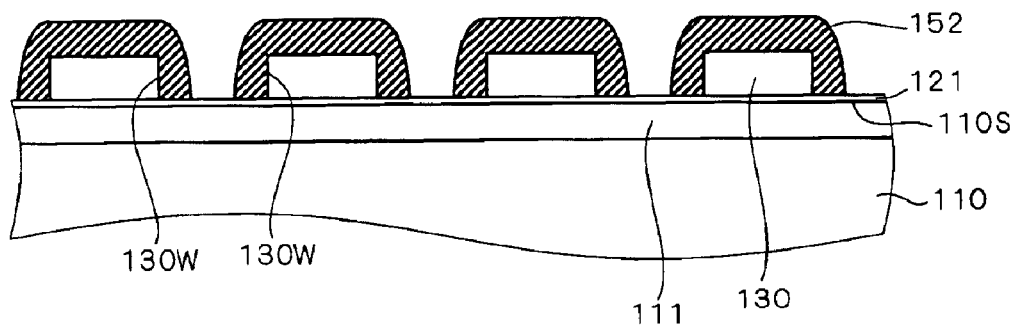

SEMICONDUCTOR DEVICE INCLUDING LOW-RESISTANCE WIRES ELECTRICALLY CONNECTED TO IMPURITY LAYERS

BACKGROUND OF THE INVENTION

1. Field of the Invention

The present invention relates to a semiconductor device. More particularly, it relates to a technique for ensuring electrical connection between a contact plug and an impurity layer even on the occurrence of misalignment of a contact hole.

2. Description of the Background Art

FIG. 31 is a perspective view illustrating a semiconductor device or semiconductor memory device 901 according to a first background art. The semiconductor device 901 is a semiconductor memory device including a plurality of transistors each having a so-called MONOS (metal-oxide-nitride-oxide-semiconductor) structure. This type of semiconductor memory device is disclosed in U.S. Pat. No. 5,768,192, for example.

The semiconductor device 901 has a plurality of N-type impurity layers 911 forming stripes in a main surface 910S of a P-type semiconductor substrate 910. An ONO film 921 serving as a gate insulating film is arranged on the main surface 910S. The ONO film 921 may be alternatively referred to as gate insulating film 921. The ONO film 921 is of a stacked structure including silicon oxide/silicon nitride/silicon oxide. To avoid complication, each layer for forming the ONO film 921 is not shown. A plurality of gate electrodes 930 are arranged on the ONO film 921. The gate electrodes 930 form stripes orthogonal to the N-type impurity layers 911. Further, an interlayer insulating film 922 is provided to cover the gate electrodes 930.

Each memory element or each unit cell of the semiconductor device 901 has a transistor structure defined by one pair of impurity layer 911 and one gate electrode 930. In each unit cell, carriers are transferred to and from the impurity layer 911 and the gate electrode 930, introducing fixed charge in the ONO film 921. The fixed charge thus introduced causes variation in threshold value of a transistor, thereby allowing storage and holding of information (data). The gate electrode 930 and the impurity layer 911 serve as a word line and a bit line, respectively. By setting voltage value to be applied to the plurality of gate electrodes 930 and to the plurality of impurity layers 911, unit cell is selected (bit is selected). The gate electrode 930 and the impurity layer 911 may be alternatively referred to as word line 930 and bit line 911, respectively.

It is generally desired to perform writing and reading of information at high speed in the semiconductor memory device. By selectively applying voltage to the word line 930 and the bit line 911, information is written in and read out in the semiconductor device 901. For speedup in writing and reading, it is required to transmit signals at high speed over the word line 930 and the bit line 911. As an effective measure for this, electrical resistance in the word line 930 and the bit line 911 should be reduced. Particularly, the bit line 911 includes an impurity layer in the semiconductor substrate 910 and therefore, the bit line 911 has relatively high resistance. In view of this, a semiconductor device according to a second background art will be introduced next having the bit line 911 lower in resistance than the one in the semiconductor device 901.

FIGS. 32 and 33 are a perspective view and a plan view (layout), respectively, illustrating a semiconductor device or semiconductor memory device 901B according to the second background art. FIGS. 34 and 35 are sectional views taken along cutting lines 34—34 and 35—35 in FIG. 33, respectively. To avoid complication, some constituent elements are suitably omitted from FIGS. 31, 32 and 33. For example, a contact plug 923 is not shown in FIG. 32.

A plurality of low-resistance wires 940 and a plurality of contact plugs 923 are added to the above-described semiconductor device 901, to reach the structure of the semiconductor device 901B. More particularly, the low-resistance wires 940 includes metal such as aluminum (Al) lower in resistance than that of the impurity layer 911. The low-resistance wires 940 form stripes extending in the same direction as that of the impurity layers 911. Further, the low-resistance wires 940 are arranged directly above the impurity layers 911.

The interlayer insulating film 922 includes a plurality of contact holes 920H formed therein. The contact holes 920H are arranged directly on the respective ones of the plurality of impurity layers 911. The contact plug 923 is provided in each contact hole 920H. Electrical connection is thus established between the low-resistance wire 940 and impurity layer 911 facing each other through the contact plug 923.

The impurity layer 911 has connection to the low-resistance wire 940 lower in resistance than the impurity layer 911. Therefore, resistance in the impurity layer (bit line) 911 is effectively reduced, thereby allowing speedup in signal transmission over the bit line 911. As a result, according to the semiconductor device 901B, writing and reading can be performed at higher speed than the semiconductor device 901.

As described, in the semiconductor device 901B, each contact plug 923 is utilized for electrically connecting the corresponding impurity layer 911 and the low-resistance wire 940. When the contact hole 920H is not formed at its proper position bringing the contact plug 923 into contact with a region of the main surface 910S other than the N-type impurity layer 911, malfunction of the semiconductor device 901B may occur. More particularly, due to the foregoing misalignment of the contact hole 920H, a short circuit occurs through the contact plug 923 between the N-type impurity layer 911 and the P-type region of semiconductor substrate 910, resulting in malfunction of the unit cell (memory element) including such impurity layer 911.

The degree of the foregoing misalignment may be reduced by ensuring alignment margin for the impurity layer 911 and the contact hole 920H to a sufficient extent. However, increase in alignment margin leads to an extended layout area. Therefore, a demand for shrinkage of a semiconductor device cannot be met. Further, the word line 930 and the bit line 911 extend to a larger degree as the layout area increases, causing increase in resistance therein. As a result, high speed operations are less effectively realized.

SUMMARY OF THE INVENTION

It is therefore an object of the present invention to provide a semiconductor device for ensuring electrical connection between a contact plug an impurity layer even on the occurrence of misalignment of a contact hole.

According to a first aspect of the present invention, the semiconductor device includes a semiconductor substrate of a first conductivity type having a main surface, a plurality of first impurity layers of a second conductivity type different from the first conductivity type, an insulating film arranged on the main surface, a plurality of gate electrodes, a plurality of low-resistance wires lower in resistance than the plurality of first impurity layers, a plurality of contact plugs, and a plurality of second impurity layers of the second conductivity type. The plurality of first impurity layers form stripes in the main surface. The plurality of gate electrodes form stripes in the insulating film crossing the plurality of first impurity layers. The plurality of low-resistance wires form stripes on the insulating film extending in the same direction as that of the plurality of first impurity layers, and each form a pair with one of the plurality of first impurity layers. The plurality of contact plugs are provided in the insulating film and arranged between adjacent ones of the plurality of gate electrodes. At least one of the plurality of contact plugs is provided to one of the plurality of low-resistance wires. Each contact plug has one end contacting corresponding one of the plurality of low-resistance wires and other end extending toward the main surface. The plurality of second impurity layers are each arranged in the main surface to correspond to one of the plurality of contact plugs. The plurality of second impurity layers each touch or overlap one of the plurality of first impurity layers. The first impurity layer forms a pair with one of the plurality of low-resistance wires having contact with a contact plug corresponding to the second impurity layer. The other ends of the contact plugs entirely touch the corresponding second impurity layer.

The other end of the contact plug entirely touches the second impurity layer of the second conductivity type. Therefore, there occurs no contact between the contact plug and a region having the first conductivity type of the semiconductor substrate. It is therefore allowed to ensure electrical connection between the first impurity layer and the low-resistance wire for forming a pair through the first and second impurity layers (each having the second conductivity type) without the problem resulting from the contact of the contact plug with the region having the first conductivity type of the semiconductor substrate. As a result, resistance in the first impurity layer for forming a signal line is reduced by the low-resistance wire, allowing speedup of the semiconductor device. At the same time, by eliminating the foregoing problem, stable and reliable operations of the semiconductor device are ensured. By eliminating the problem and ensuring electrical connection as described, reduction in layout area and eventually, shrinkage of the semiconductor device are allowed. That is, speedup and shrinkage are simultaneously promoted.

According to a second aspect of the present invention, the semiconductor device includes a semiconductor substrate of a first conductivity type having a main surface, a plurality of impurity layers of a second conductivity type different from the first conductivity type, an insulating film arranged on the main surface, a plurality of gate electrodes, a plurality of low-resistance wires lower in resistance than the plurality of impurity layers, and a plurality of contact plugs. The plurality of impurity layers form stripes in the main surface. The plurality of gate electrodes form stripes in the insulating film crossing the plurality of impurity layers. The plurality of low-resistance wires form stripes on the insulating film extending in the same direction as that of the plurality of impurity layers, and each form a pair with each one of the plurality of impurity layers. The plurality of contact plugs are provided in the insulating film and arranged between adjacent ones of the plurality of gate electrodes. At least one of the plurality of contact plugs is provided to a pair including the low-resistance wire and the impurity layer, and contacts the low-resistance wire and the impurity layer for forming the pair. The insulating film includes a plurality of first insulating films arranged between adjacent ones of the plurality of impurity layers for holding each one of the plurality of impurity layers therebetween, and a plurality of second insulating films arranged at least between adjacent ones of the plurality of gate electrodes for holding each one of the plurality of contact plugs therebetween.

The impurity layer is interposed between the first insulating films. Therefore, there exists no region having the first conductivity type of the semiconductor substrate between the impurity layer of the second conductivity type and the first insulating film. As a result, even when a hole for forming a contact plug (contact hole) deviates from its proper position in a direction along which the impurity layers are arranged, electrical contact between the contact plug and the region having the first conductivity type of the semiconductor substrate is reliably prevented by the presence of the first insulating film. Further, the second insulating film is arranged at least between adjacent gate electrodes for holding each contact plug therebetween. Therefore, even when the contact plug deviates from its proper position along an extending direction of the impurity layer, electrical contact between the contact plug and the gate electrode is reliably prevented by the presence of the second insulating film. In view of this, it is allowed to ensure electrical connection between the impurity layer and the low-resistance wire for forming a pair without the problem resulting from the contact of the contact plug with the region having the first conductivity type of the semiconductor substrate and with the gate electrode. As a result, resistance in the impurity layer for forming a signal line is reduced by the low-resistance wire, allowing speedup of the semiconductor device. At the same time, by eliminating the foregoing problem, stable and reliable operations of the semiconductor device are ensured. By eliminating the problem and ensuring electrical connection as described, reduction in layout area and eventually, shrinkage of the semiconductor device are allowed. That is, speedup and shrinkage are simultaneously promoted.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view illustrating a semiconductor device according to a first preferred embodiment of the present invention;

FIG. 2 is a plan view illustrating the semiconductor device according to the first preferred embodiment of the present invention;

FIGS. 20 through 22 are sectional views illustrating a method of manufacturing a semiconductor device according to the second preferred embodiment of the present invention;

FIGS. 26 through 28 are sectional views illustrating a method of manufacturing a semiconductor device according to the third preferred embodiment of the present invention;

DESCRIPTION OF THE PREFERRED EMBODIMENTS

First Preferred Embodiment

Figure 3:
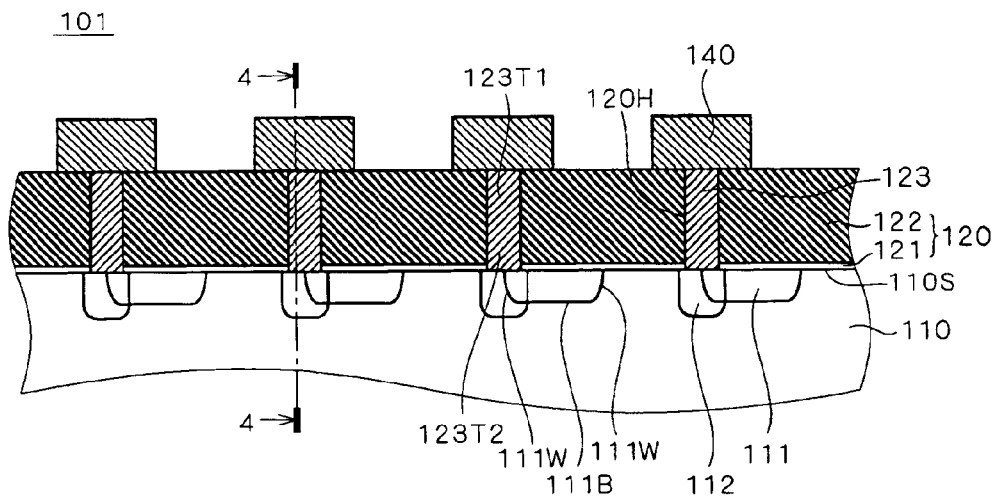
FIGS. 3 and 4 are sectional views illustrating the semiconductor device according to the first preferred embodiment of the present invention.
Figure 4:
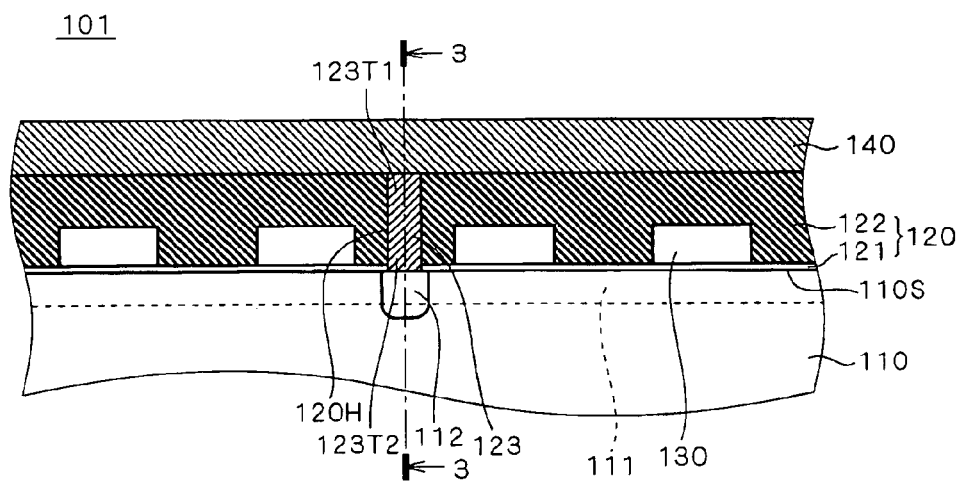
Figure 5:
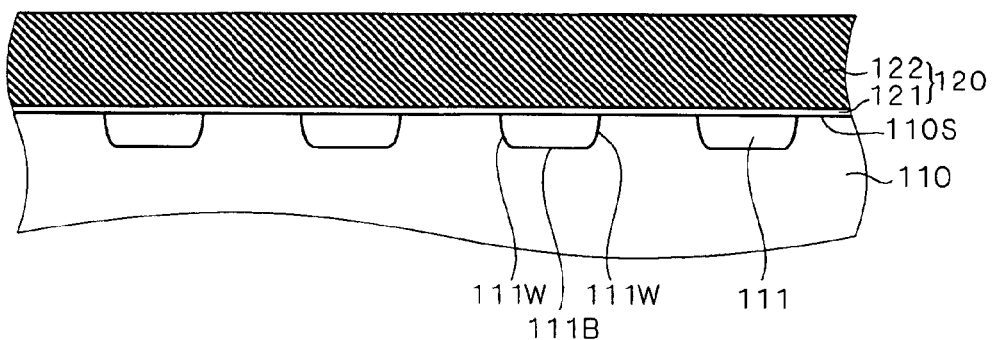
FIGS. 5 through 8 are sectional views illustrating a method of manufacturing a semiconductor device according to the first preferred embodiment of the present invention.
Figure 6:
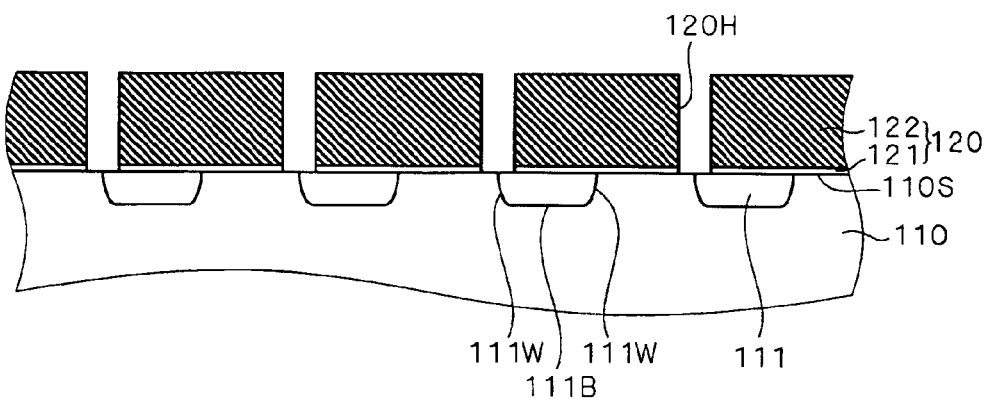
Figure 7:
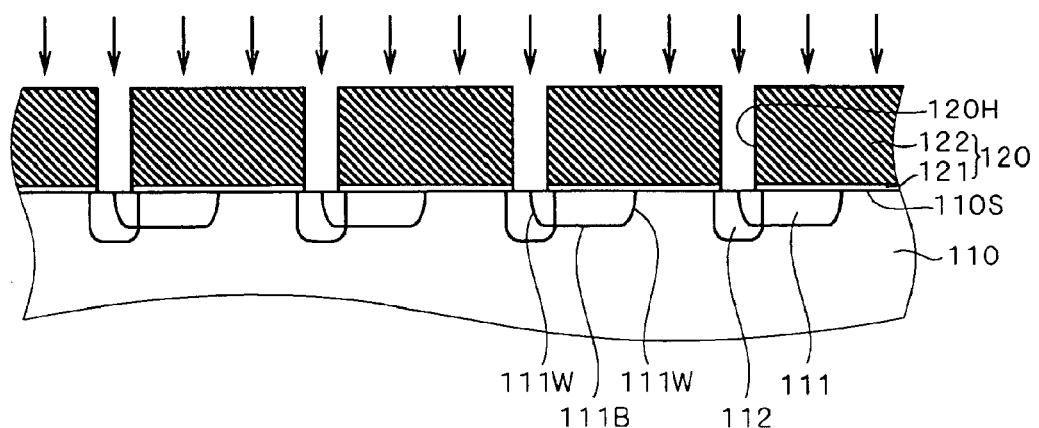

FIGS. 1 and 2 are a perspective view and a plan view (layout), respectively, illustrating a semiconductor device or semiconductor memory device 101 according to the first preferred embodiment of the present invention. FIGS. 3 and 4 are sectional views taken along cutting lines 3—3 and 4—4 in FIG. 2, respectively. To avoid complication, some constituent elements are suitably omitted from FIGS. 1 through 4, and from to-be-described figures. For example, a contact plug 123 is not shown in FIG. 1.

The semiconductor device 101 is a semiconductor memory device including a plurality of transistors arranged in a matrix. Each transistor has a so-called MONOS (metal-oxide-nitride-oxide-semiconductor) structure. The semiconductor device 101 has a semiconductor substrate 110, a plurality of first impurity layers 111, an insulating film 120, a plurality of gate electrodes 130, a plurality of low-resistance wires 140, a plurality of second impurity layers 112, and a plurality of contact plugs 123. The contact plug may be simply referred to as "contact" or "plug".

In more detail, the semiconductor substrate 110 is a P-type (or first conductivity type) silicon substrate, for example. The plurality of first impurity layers 111 are provided in a main surface 110S of the semiconductor substrate 110 (more particularly, the first impurity layers 111 extend to a predetermined depth, starting from the main surface 110S). The plurality of first impurity layers 111 have an N type (or second conductivity type) opposite to the conductivity type of the semiconductor substrate 110. The plurality of first impurity layers 111 form stripes. In the preferred embodiment, the first conductivity type is defined as a P type and the second conductivity type as an N type. However, definition of the first and second conductivity types is interchangeable therebetween. Even the definition is interchanged, the following description is still applicable.

An insulating film 120 is arranged on the main surface 110S of the semiconductor substrate 110. The insulating film 120 of the semiconductor device 101 includes a gate insulating film 121 and an interlayer insulating film 122. The plurality of gate electrodes 130 are buried in the insulating film 120. More particularly, the gate insulating film 121 is entirely provided on the main surface 110S of the semiconductor substrate 110. The plurality of gate electrodes 130 are arranged on the gate insulating film 121 to face the main surface 110S through the gate insulating film 121. The interlayer insulating film 122 is arranged on the gate insulating film 121 to cover the gate electrodes 130. The interlayer insulating film 122 is a silicon oxide film, for example. The interlayer insulating film 122 of the semiconductor device 101 are in contact with the plurality of gate electrodes 130.

As given in FIG. 11 to be described later, the gate insulating film 121 includes a silicon oxide film 121a, a silicon nitride film 121b and a silicon oxide film 121c stacked in this order on the main surface 110S of the semiconductor substrate 110. Namely, the gate insulating film 121 is an ONO film and therefore, may be alternatively referred to as ONO film 121. Provided that the gate insulating film 121 is arranged between the plurality of gate electrodes 130 and the main surface 110S of the semiconductor substrate 110, or in plan view, is provided in a region 110R defined between adjacent first impurity layers 111 (corresponding to a channel-forming region) and in the vicinity of the region 110R, the semiconductor device 101 is desirably operable. In view of this, instead of the single gate insulating film 121 entirely extending on the main surface 110S of the semiconductor substrate 110, a plurality of gate insulating films 121 may be provided (see for example, FIGS. 11 and 16).

In plan view, the plurality of gate electrodes 130 form stripes crossing the plurality of first impurity layers 111 (here, orthogonal to the layers 111). The plurality of gate electrodes 130 include polysilicon, for example.

The plurality of low-resistance wires 140 are arranged on the insulating film 120 (in more detail, on the interlayer insulating film 122) to face the main surface 110S of the semiconductor substrate 110 through the insulating film 120 and the plurality of gate electrodes 130. These low-resistance wires 140 form stripes extending in the same direction as that of the first impurity layers 111. Each one of the plurality of low-resistance wires 140 and each one of the plurality of first impurity layers 111 form a pair. Each low-resistance wire 140 is located in a region directly above the first impurity layer 111 for forming a pair together and in the vicinity thereof. The plurality of low-resistance wires 140 include material such as metal and silicide having resistance lower than that of the first impurity layers 111.

The insulating film 120 includes a plurality of contact holes 120H provided therein penetrating the insulating film 120 in a depth direction thereof. The contact plug 123 is formed in each contact hole 120H. In the semiconductor device 101, each low-resistance wire 140 is provided with one contact hole 120H and one contact plug 123 as a pair (a set). One end 123T1 of each contact plug 123 touches the corresponding low-resistance wire 140 and the other end 123T2 thereof extends toward the main surface 110S of the semiconductor substrate 110.

In the semiconductor device 101, the plurality of N-type second impurity layers 112 are provided in the main surface 110S of the semiconductor substrate 110. Each contact plug 123 is provided with one second impurity layer 112. The second impurity layer 112 overlaps the first impurity layer 111 that forms a pair with the low-resistance wire 140 having contact with the contact plug 123 corresponding to the second impurity layer 112. More particularly, the first and second impurity layers 111 and 112 are continuously arranged, partially sharing a region therebetween. The shared region is higher in impurity concentration than both unshared regions in the first and second impurity regions 111 and 112. In FIG. 3 and to-be-described figures, the second impurity layer 112 is shown to have a depth greater than the depth of a bottom surface 111B of the first impurity layer 111. Alternatively, the second impurity layer 112 may be shallower than the depth of the bottom surface 111B.

The other end 123T2 of each contact plug 123 entirely touches the second impurity layer 112 (including the foregoing shared region). Therefore, there occurs no contact between each contact plug 123 and the P-type region of the main surface 110S of the semiconductor substrate 110. Further, the second impurity layer 112 is provided in a region directly under the contact hole 120H, contact plug 123 and in the vicinity thereof.

In plan view, the contact plug 123 is located between adjacent gate electrodes 130 yet having no contact therewith. Further, the contact plugs 123 and the second impurity layers 112 are both arranged in a direction (in other words, in an extending direction of the gate electrodes 130) with the same spacing as the first impurity layers 111. In FIG. 2, a plurality of pairs each including the second impurity layer 112 and the contact plug 123 lie in line. Alternatively, these pairs may be placed in zigzag.

Next, with further reference to the sectional view of FIGS. 5 through 8 corresponding to FIG. 3, the method of manufacturing the semiconductor device 101 will be described.

First, the P-type semiconductor substrate 110 is prepared. Next, the plurality of N-type first impurity layers 111 are provided to form stripes in the main surface 110S of the semiconductor substrate 110 (see FIG. 5).

Thereafter the insulating film 120 is provided on the main surface 110S of the semiconductor substrate 110 and the plurality of gate electrodes 130 are provided in the insulating film 120. More particularly, as an example, the main surface 110S of the semiconductor substrate 110 is oxidized to form a silicon oxide film, on which a silicon nitride film and a silicon oxide film are subsequently stacked in this order. The gate insulating film 121 forming one part of the insulating film 120 is thereby provided on the main surface 110S (see FIG. 5). Thereafter, the plurality of gate electrodes 130 are provided on the gate insulating film 121. The gate electrodes 130 form stripes crossing the plurality of first impurity layers 111. The interlayer insulating film 122 forming another part of the insulating film 120 is thereafter provided to cover the plurality of gate electrodes 130 (see FIG. 5).

Next, the insulating film 120 is etched to form the contact holes 120H in the insulating film 120 (see FIG. 6) in a one-to-one correspondence to the first impurity layers 111 in plan view. Thereafter N-type dopants such as phosphorous and arsenic are implanted by ion implantation into the main surface 110S of the semiconductor substrate 110 through the plurality of contact holes 120H, to form the plurality of second impurity layers 112 (see FIG. 7). At this time, conditions for ion implantation or conditions for both ion implantation and annealing to be performed later are established such that the second impurity layers 112 are each arranged in a region directly under the corresponding contact hole 120H and in the vicinity thereof, and the second impurity layers 112 each overlap (overlap in part) the corresponding the first impurity layer 111.

Figure 8:
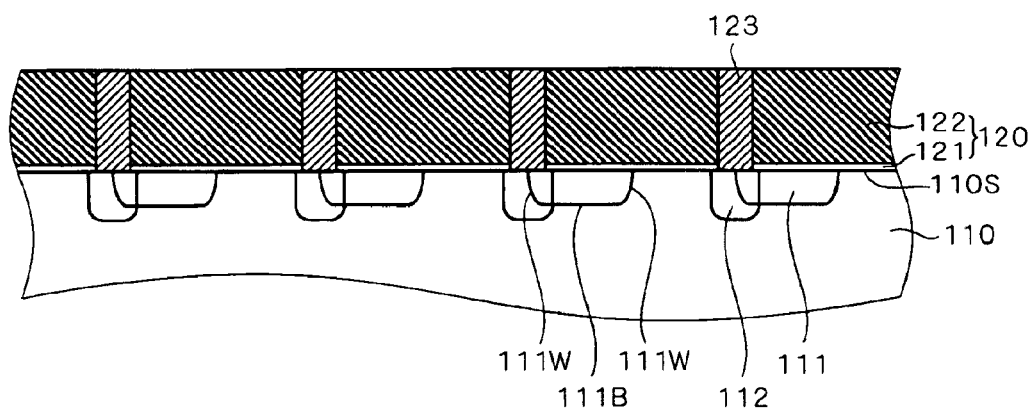

Thereafter the contact plug 123 is provided in each contact hole 120H (see FIG. 8). Further, the plurality of low-resistance wires 140 are provided on the insulating film 120 (in more detail, on the interlayer insulating film 122). The low-resistance wires 140 form stripes extending in the same direction as that of the plurality of first impurity layers 111. Further, the low-resistance wires 140 are each in contact with one end 123T1 of the corresponding contact plug 123, thus establishing electrical connection between the low-resistance wire 140 and the first impurity layer 111 for forming a pair through the corresponding contact plug 123 and the corresponding second impurity layer 112. The semiconductor device 101 is thereby completed.

With reference to FIGS. 9 through 13, fundamental operations of the semiconductor device 101 will be described. FIGS. 9 through 13 each illustrate the semiconductor device 101 in part.

Figure 9:
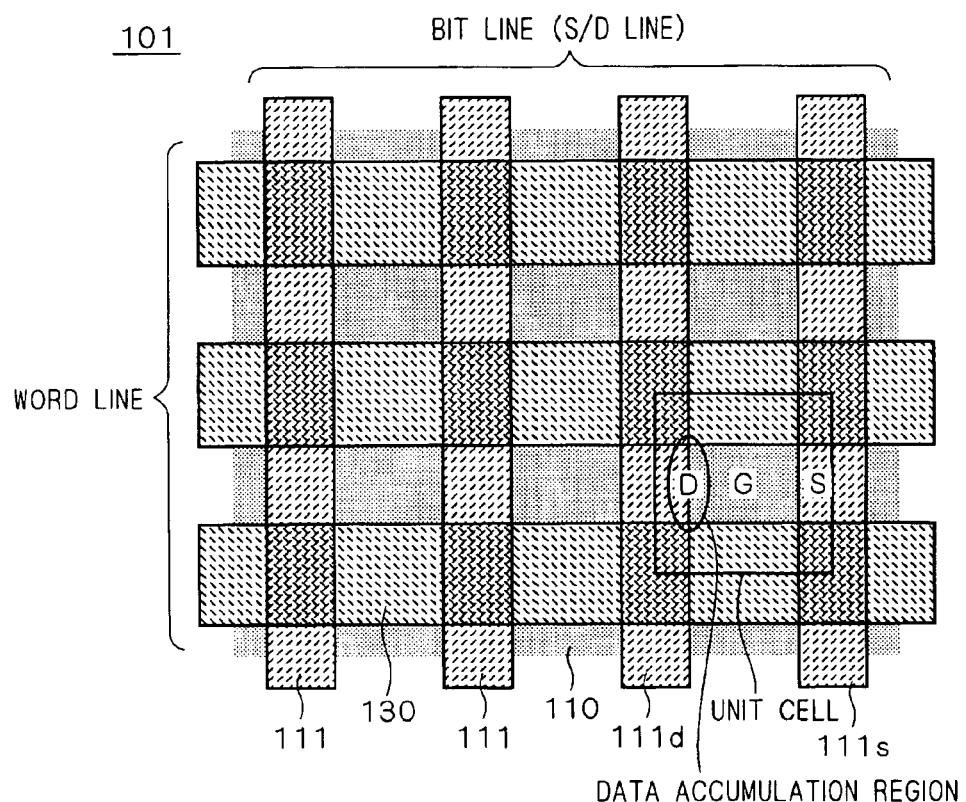
FIGS. 9 through 13 are sectional views illustrating fundamental operations of the semiconductor device according to the first preferred embodiment of the present invention.

As shown in the plan view (layout) of FIG. 9, each memory element or unit cell of the semiconductor device 101 has a transistor structure defined by a pair of impurity layers (bit lines) 111 and one gate electrode (word line) 130. One impurity layer 111 for forming the pair may be alternatively referred to as source region 111s and the other one as drain region 111d.

Figure 10:
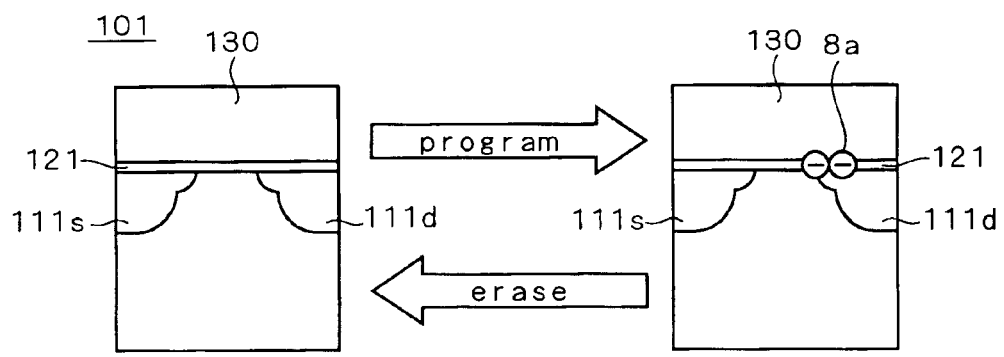

FIG. 10 is a sectional view illustrating one unit cell. The semiconductor device 101 includes a so-called NROM (as a subspecies of a flash memory) belonging to ROM. The semiconductor device 101 is capable of accumulating negative charges (electrons, for example) in the gate insulating film (ONO film) 121 in the vicinity of an end portion of the drain region 111d, namely, the end portion when viewed from the side of the source region 111s. According to the presence or absence of these in-film charges 8a, the semiconductor device 101 accumulates data (information). Based on the variation in threshold value caused by the raise in source voltage, the presence or absence of the in-film charges 8a on the side of the drain region 111d is recognized (detected). This threshold value is higher in the presence of the in-film charges 8a than in the absence of the same. In contrast, when a drain voltage is raised, a depletion layer is formed in the vicinity of the drain region 111d, shielding possible effect caused by the in-film charges 8a. Therefore, effect on the threshold value caused by the in-film charges 8a can be neglected. The in-film charges 8a are accumulated on the side of the source region 111s and in another case, on the side of the drain region 111d. According to such variation in region for accumulating the charges 8a, information can be accumulated in a completely independent manner. That is, one transistor structure is allowed to handle two types of information (two bits per one cell).

Next, with reference to the sectional views of FIGS. 11 through 13, the fundamental operations of the unit cell of the semiconductor device 101 will be discussed in more detail. These operations will be discussed in the case where the in-film charges 8a are trapped in the silicon nitride film 121b of the ONO film 121 on the side of the drain region 111d.

Figure 11:
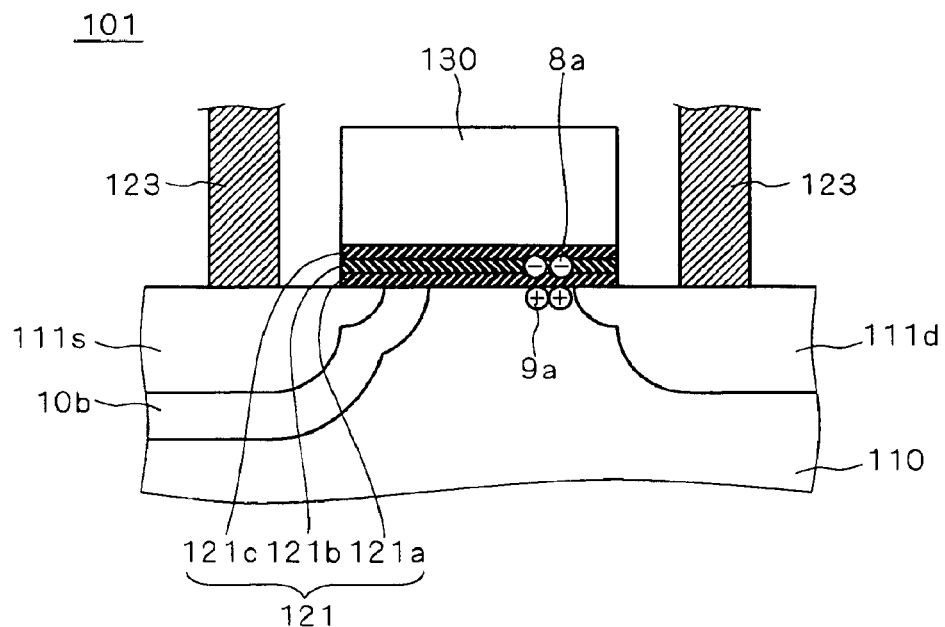

Induced by the in-film charges 8a, in-channel positive charges (holes, for example) 9a are generated in the channel-forming region of the semiconductor substrate 110 receiving no voltage as given in FIG. 11. The negative charges 8a are trapped only in the vicinity of the drain region 111d and therefore, the positive charges 9a do not appear on the side of the source region 111s. As a result, the amount of the in-channel charges 9a will be different between the area defined on the side of the drain region 111d and the area on the side of the source region 111s.

Resulting from these in-film charges 8a and the in-channel charges 9a, the threshold value for forming a channel differs between forward bias and reverse bias to be applied across the drain and source (asymmetry of the threshold value).

Figure 12:
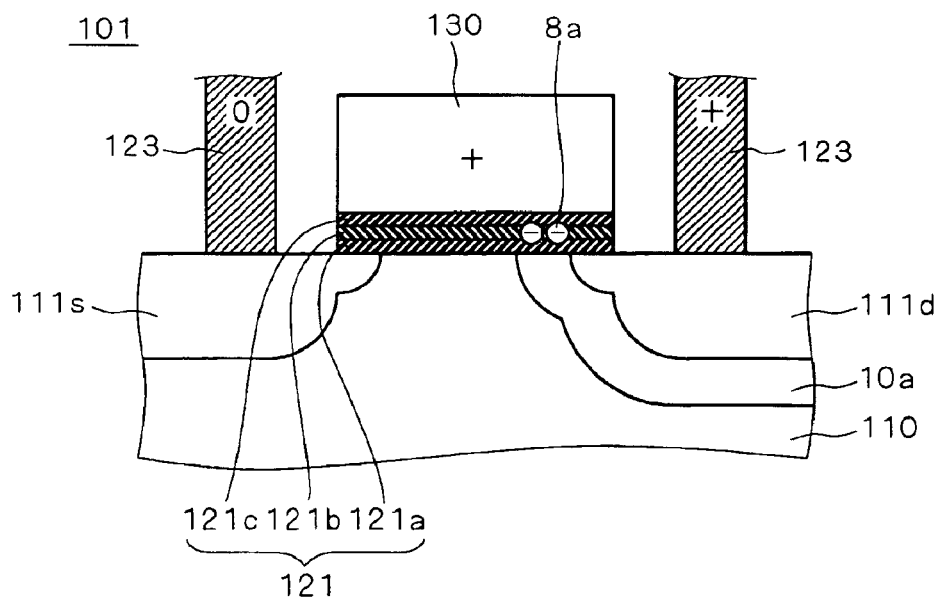

That is, when a forward bias voltage is applied across the drain and source, namely, the voltage bringing the drain into higher potential than the source, a depletion layer 10a is formed at a PN junction between the N-type drain region 111d and the P-type region of the semiconductor substrate 110 as shown in FIG. 12. In FIG. 12, "0" means 0 V and "+" means positive voltage value. Due to the formation of the depletion layer 10a, the induced in-channel charges 9a disappear.

When a forward bias voltage is applied in this condition across the gate and source, namely, the voltage bringing the gate into higher potential than the source, an N-type channel is formed in the main surface 110S directly under the gate insulating film 121, allowing a drain-source current to flow. At this time, the in-channel charges 9a are cancelled out by the depletion layer 10a, causing no effect on the formation of the N-type channel.

Figure 13:
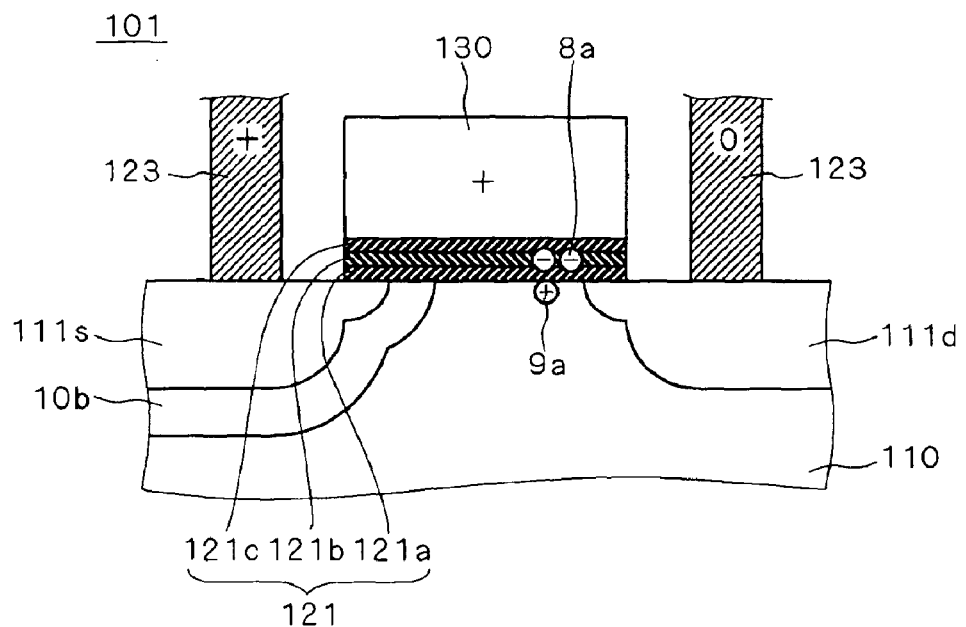

In contrast, when a reverse bias voltage is applied across the drain and source, namely, the voltage bringing the source into higher potential than the drain, a depletion layer 10b is formed at a PN junction between the N-type source region 111s and the P-type region of the semiconductor substrate as shown in FIG. 13.

In this state, when a voltage is applied across the gate and drain bringing the gate into higher potential than the drain, a structure operable in the same manner as in FIG. 12 yet switching the functions between the drain and source therein is obtained.

In FIG. 13, the depletion layer 10a to be formed at the PN junction between the drain region 111d and the P-type region of the semiconductor substrate 110 does not exist. Therefore, the induced in-channel charges 9a still remain. Resulting from the voltage applied across the gate and drain, however, electric field of the in-channel charges 9a is lowered to some extent by the potential of the gate electrode 130. In FIG. 13, such lowering of the electric field is indicated by the reduced number of the in-channel charges.

When the in-channel charges 9a remain, the N-type channel extends from the source region 111s only to the in-channel charges 9a, failing to reach the drain region 111d. Namely, the N-type channel cannot be formed sufficiently, resulting in difficulty in flow of the source-drain current.

In order to completely cancel out the in-channel charges 9a, the gate-drain voltage should be raised. This means that when a bias voltage is applied across the drain and source, the threshold value for forming the channel of a unit cell differs between forward direction and reverse direction (asymmetry of threshold voltage).

When there is no trapping of the negative charges 8a and no induction of the in-channel charges 9a, the threshold value in FIG. 13 will be naturally the same as in FIG. 12. The technique in U.S. Pat. No. 5,768,192 introduced above utilizes the foregoing variation in threshold value resulting from the presence or absence of the negative charges 8a in a non-volatile semiconductor memory device. That is, on the basis of the variation in threshold value during application of a reverse bias voltage, it is determined whether the negative charges 8a are trapped or not.

As described above, the second impurity layer 112 is formed by implanting N-type dopants by ion implantation into the main surface 110S of the semiconductor substrate 110 through the contact hole 120H. Therefore, the other end 123T2 of the contact plug 123 can be always in contact with the second impurity layer 112 entirely, yet it does not contact the P-type region of the semiconductor substrate 110. Further, the second impurity layer 112 is formed in such a manner that it overlaps the first impurity layer 111. As a result, even when misalignment of the contact hole 120H occurs (see FIG. 2) interfering direct contact between the contact plug 123 and the first impurity layer 111, the contact plug 123 can be electrically connected to the first impurity layer 111 through the second impurity layer 112 having the same conductivity type as that of the first impurity layer 111.

In the semiconductor device 101, it is therefore allowed to ensure electrical connection between the fist impurity layer 111 and the low-resistance wire 140 for forming a pair through the N-type first and second impurity layers 111 and 112 without the problem resulting from the contact of the other end 123T2 of the contact plug 123 with the P-type region of the semiconductor substrate 110. As a result, resistance in the first impurity layer 111 for forming a signal line (bit line) is reduced by the low-resistance wire 140, allowing speedup of the semiconductor device 101. At the same time, by eliminating the foregoing problem, stable and reliable operations of the semiconductor device 101 are ensured. By eliminating the problem and ensuring electrical connection as described, the semiconductor device 101 further advantageously reduces alignment margin for the first impurity layer 111 and the contact hole 120H as compared with the background-art semiconductor device 901B, leading to reduction in layout area and eventually, leading to shrinkage of the semiconductor device 101. That is, according to the semiconductor device 101, speedup and shrinkage are simultaneously promoted.

Figure 14:
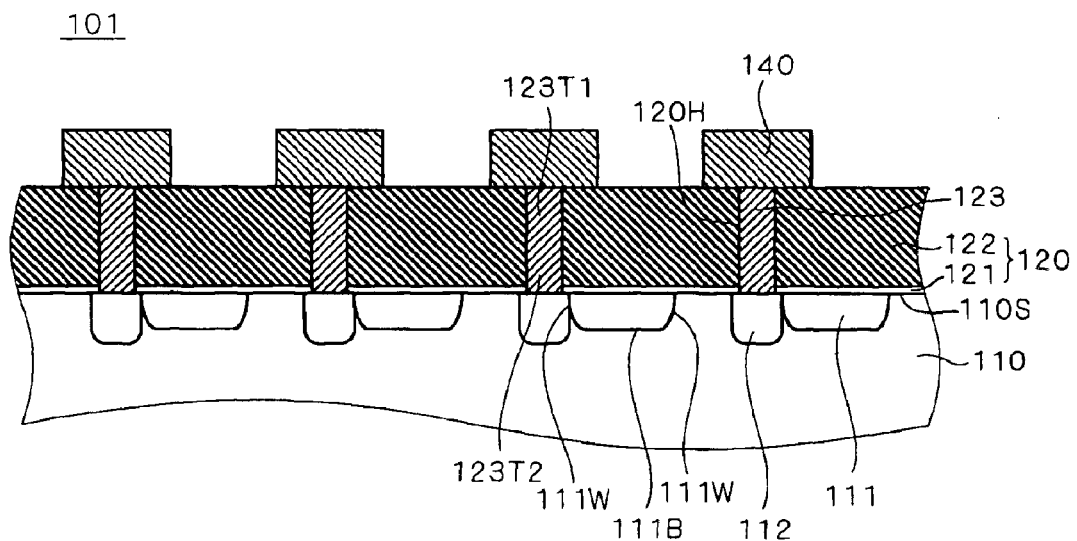
FIG. 14 is a sectional view illustrating the semiconductor device according to the first preferred embodiment of the present invention.

As seen from the sectional view of FIG. 14, the second impurity layers 112 may be continuously arranged each contacting a side surface 111W of the first impurity layer 111. The effects as described can be also produced in this structure.

When the contact plug 123 and the low-resistance wire 140 cumulatively deviate from their proper positions relative to the first impurity layer 111, misalignment may occur to such a degree that the first impurity layer 111 and the low-resistance wire 140 for forming a pair cannot overlap each other in plan view (although this depends on the dimension of each constituent element). Even the semiconductor device 101 having such arrangement produces the foregoing effects.

Figure 15:
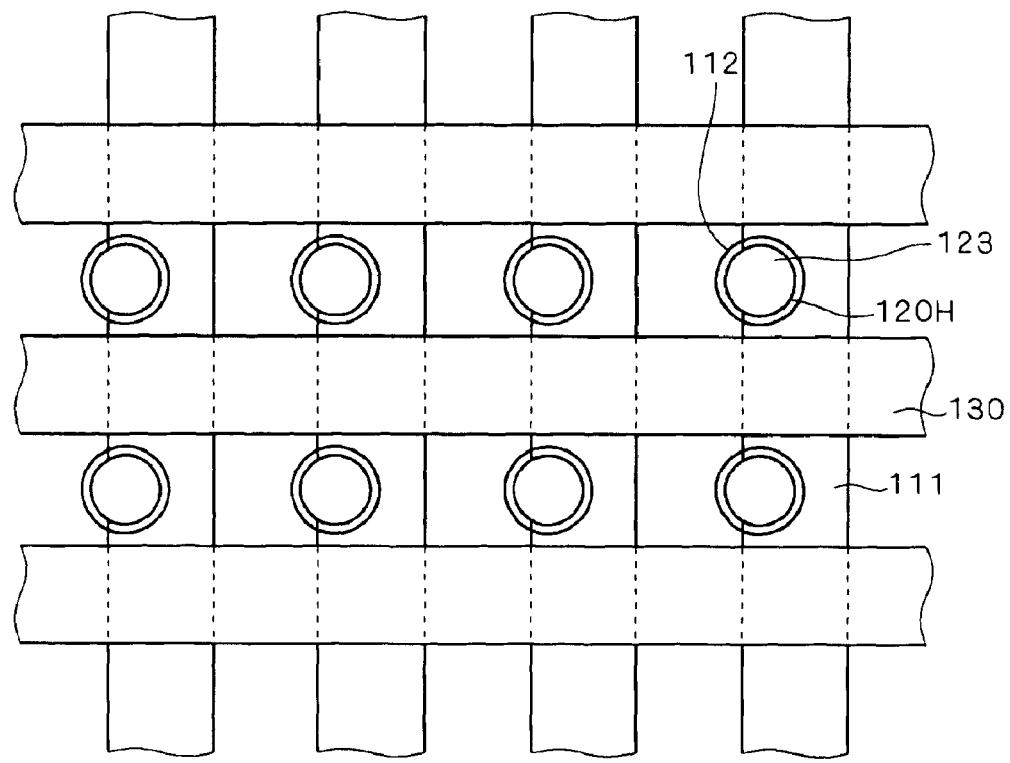
FIG. 15 is a plan view illustrating a first modification of the semiconductor device according to the first preferred embodiment of the present invention.

As seen from a semiconductor device 101B given in the plan view of FIG. 15, the first impurity layer 111 may be each provided with a plurality of pairs each including the second impurity layer 112 and the contact plug 123. According to this structure, effective resistance in the first impurity layer 111 can be reduced to a greater degree. The configuration of the semiconductor device 101B is basically the same in the other respects as that of the semiconductor device 101. In to-be-described devices such as a semiconductor device 101C, each pair including the first impurity layer 111 and the low-resistance wire 140 may be provided with a plurality of contact plugs 123 (or alternatively, with a plurality of contact plugs 123 and second impurity layers 112).

Figure 16:
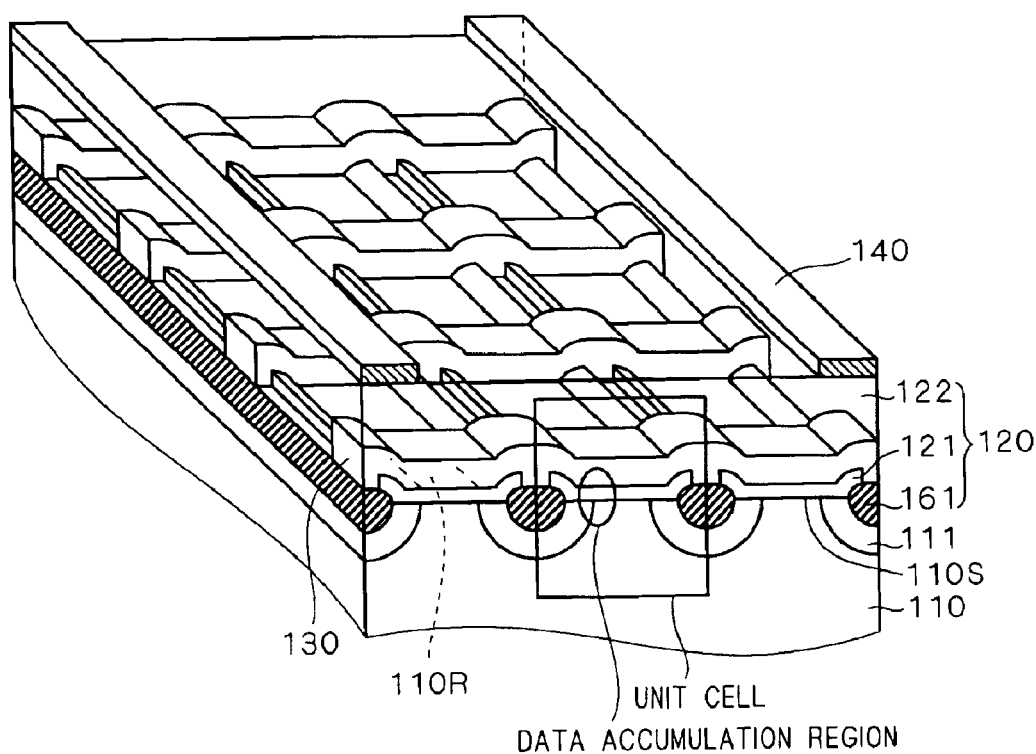
FIG. 16 is a perspective view illustrating a second modification of the semiconductor device according to the first preferred embodiment of the present invention.

Still alternatively, as seen from a semiconductor device 101C given in the perspective view of FIG. 16, the insulating film 120 may be a film including a plurality of gate insulating films 121, the interlayer insulating film 122, and a plurality of isolating insulation films 161. To avoid complication, some constituent elements are omitted from FIG. 16. For example, some of the low-resistance wires 140 and the contact plug 123 are not shown in FIG. 16. However, the configuration of the semiconductor device 101C is basically the same in the other respects as that of the semiconductor device 101.

In the semiconductor device 101C, the plurality of isolating insulation films 161 may be each silicon oxide film, for example, having a thickness greater than that of the gate insulating film 121. The plurality of isolating insulation films 161 are each provided to the corresponding one of the impurity layers 111. The isolating insulation film 161 is arranged on the corresponding first impurity layer 111 (namely, on the main surface 110S of the semiconductor substrate 110), extending along the first impurity layer 111. The isolating insulation films 161 are each provided in a depression of the main surface 110S of the semiconductor substrate 110. The first impurity layers 111 are each arranged along such depression. The plurality of isolating insulation films 161 may be provided by LOCOS isolation process or trench isolation process. Further, either the isolating insulation film 161 or the first impurity layer 111 can be provided first.

The plurality of gate insulating films 121 are defined by dividing the single gate insulating film 121 given in FIG. 1 at the points of the isolating insulation films 161. Each gate insulating film 121 is arranged between adjacent isolating insulation films 161, extending along each insulation film 161. The adjacent gate insulating film 121 and the isolating insulation film 161 are in contact with each other such that the gate electrode 130 does not touch the main surface 110S of the semiconductor substrate 110.

In the semiconductor device 101C, there exists no gate insulating film 121 having a small thickness in a region distant from the channel-forming region (corresponding to the region 110R as described). Rather, the isolating insulation film 161 having a greater thickness is arranged in such region. In the region distant from the channel-forming region, it is thus allowed to control influence on the gate insulating film 121 and the first impurity layer 111 exerted by gate voltage (electric field). As a result, reliability can be improved.

The configuration including the plurality of gate insulating films 121 and/or isolating insulation films 161 can be further applicable to the foregoing semiconductor device 101B and to-be-described semiconductor device 102, for example.

Second Preferred Embodiment

Figure 17:
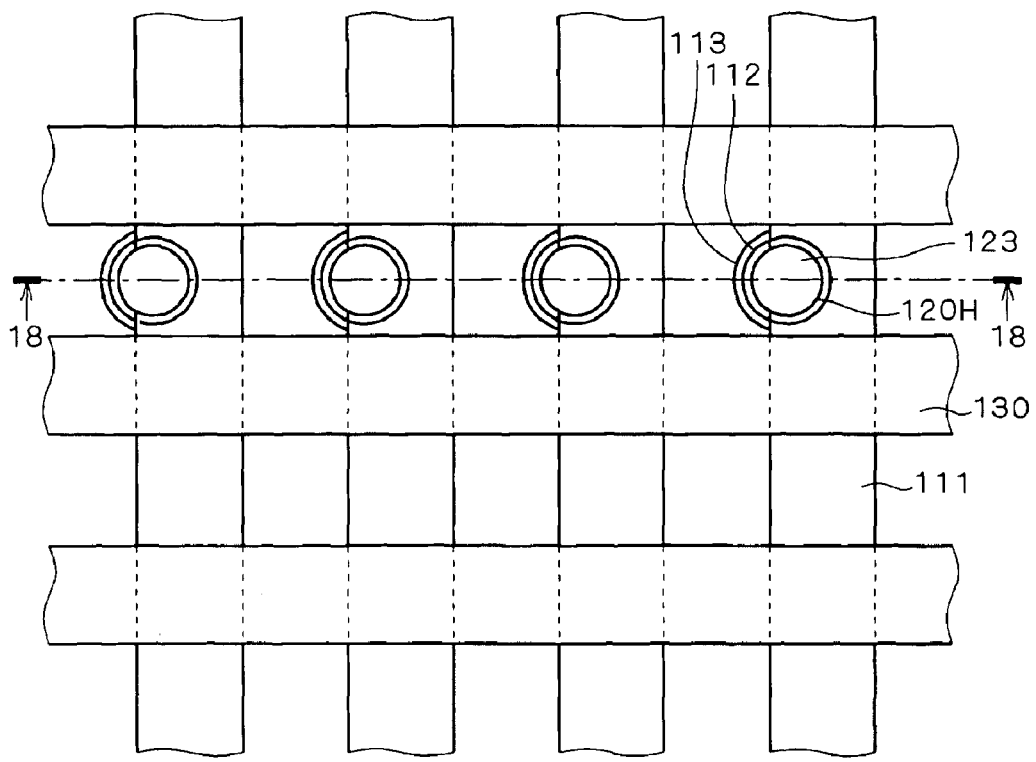
FIG. 17 is a plan view illustrating a semiconductor device according to a second preferred embodiment of the present invention.
Figure 18:
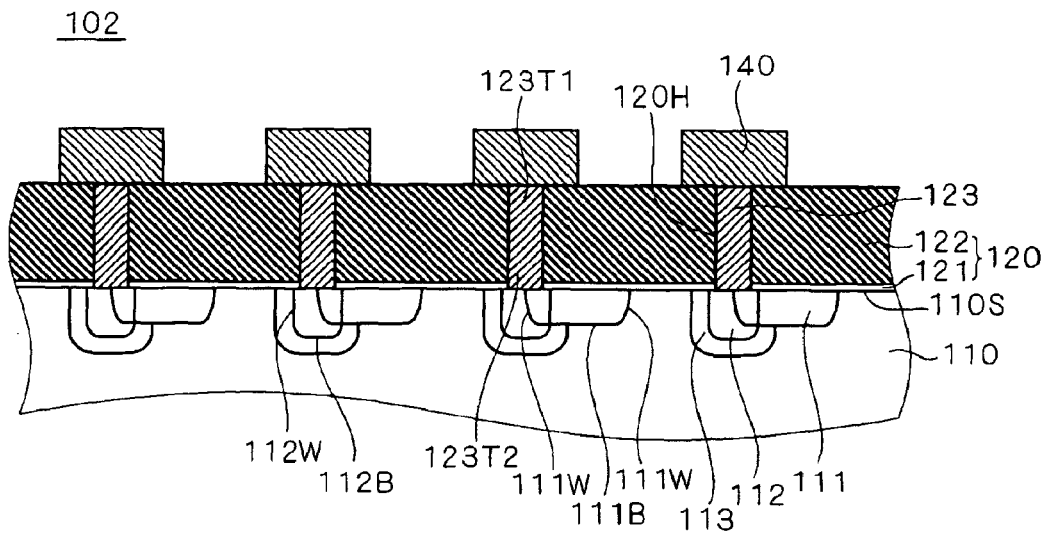
FIG. 18 is a sectional view illustrating the semiconductor device according to the second preferred embodiment of the present invention.

FIG. 17 is a plan view (layout) illustrating a semiconductor device or semiconductor memory device 102 according to the second preferred embodiment of the present invention. FIG. 18 is a sectional view taken along a cutting line 18—18 in FIG. 17.

The basic difference in configuration between the semiconductor devices 101 and 102 is a plurality of third impurity layers added to the semiconductor device 102. More particularly, the plurality of third impurity layers 113 are the same in conductivity type as the semiconductor substrate 110, namely, P type. Further, the third impurity layers 113 are higher in impurity concentration than the semiconductor substrate 110. The plurality of third impurity layers 113 are provided in the main surface 110S of the semiconductor substrate 110 and further, are each provided to the corresponding one of the plurality of second impurity layers 112. Each one of the third impurity layers 113 is in contact with a side surface 112W and a bottom surface 112B of the corresponding second impurity layer 112, and with the main surface 110S of the semiconductor substrate 110, entirely covering the corresponding second impurity layer 112. Each one of the third impurity layers 113 is also in contact with the bottom surface 111B of the first impurity layer 111. The third impurity layer 113 partially exists between the second impurity layer 112 and the adjacent first impurity layer 111 having no contact with this second impurity layer 112. Namely, third impurity layer 113 is arranged between adjacent first impurity layers 111. In the semiconductor device 102, the contact plug 123 also has no contact with the P-type region of the main surface 110S of the semiconductor substrate 110 (including the third impurity layer 113).

By forming the third impurity layer 113, the range of a depletion layer to be formed with respect to the first and second impurity layers 111 and 112 adjacent to each other through the third impurity layer 113 is controlled, thereby preventing punch-through between these adjacent first and second impurity layers 111 and 112 adjacent to each other. As compared with the semiconductor device 101, it is therefore allowed in the semiconductor device 102 to reduce layout area and promote shrinkage to a greater degree.

The prevention of punch-through as described is realized as long as the third impurity layer 113 is in contact with at least the side surface 112W of the corresponding second impurity layer 112 and the third impurity layer 113 is arranged between the first impurity layers 111. In view of this, as seen from a semiconductor device 102B given in the sectional view of FIG. 19, third impurity layers 113B may be each arranged between the first impurity layers 111 under conditions that each one of the third impurity layers 113B is in contact with the main surface 110S of the semiconductor substrate 110 and with only a part of the side surface 112W of the corresponding second impurity layer 112. The configuration of the semiconductor device 102B is basically the same in the other respects as that of the semiconductor device 102. The third impurity layer 113 covering the larger area of the second impurity layer 112 than the third impurity layer 113B is more effective in the foregoing prevention of punch-through and in the foregoing reduction in layout area.

Next, with further reference to the sectional views of FIGS. 20 through 22 corresponding to FIG. 18, the method of manufacturing the semiconductor devices 102 and 102B will be described. First, following the same steps of the manufacturing method of the first preferred embodiment up to the step of forming the plurality of contact holes 120H, the semiconductor device 101 is prepared (see FIG. 6).

Figure 20:
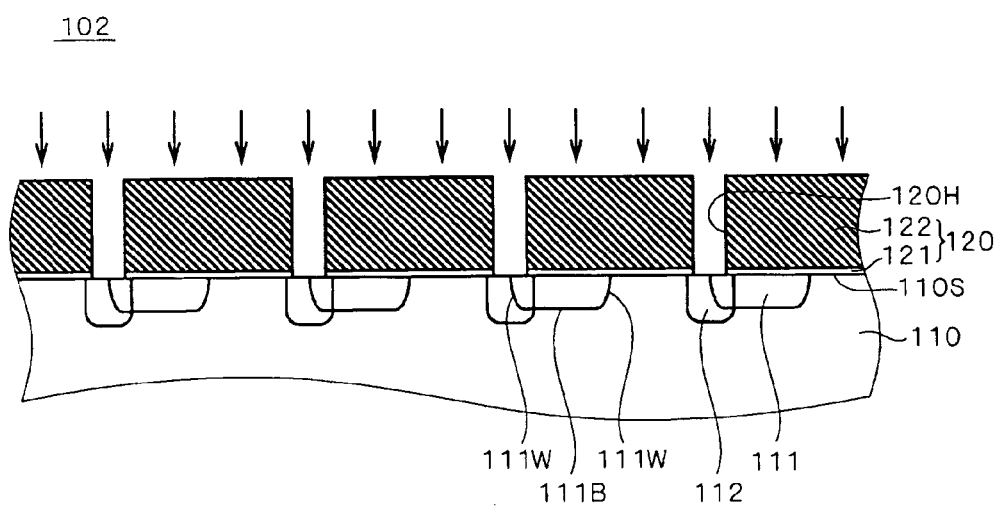

Next, similar to the manufacturing method of the first preferred embodiment, N-type dopants such as phosphorous and arsenic are implanted by ion implantation into the main surface 110S of the semiconductor substrate 110 through the plurality of contact holes 120H, to form the plurality of second impurity layers 112 (see FIG. 20). At this time, conditions for ion implantation or conditions for both ion implantation and annealing to be performed later are established such that the second impurity layers 112 are each arranged in a region directly under the corresponding contact hole 120H and in the vicinity thereof, and the second impurity layers 112 each overlap (overlap in part) the corresponding the first impurity layer 111.

Figure 21:
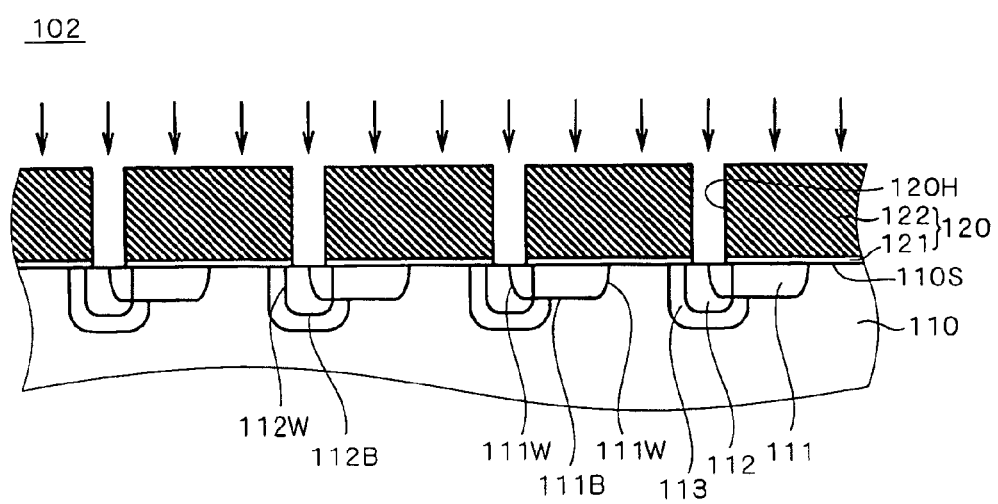

Thereafter P-type dopants such as boron are further implanted by ion implantation into the main surface 110S of the semiconductor substrate 110 through the plurality of contact holes 120H, to form the plurality of third impurity layers 113 (see FIG. 21). At this time, conditions for ion implantation or conditions for both ion implantation and annealing to be performed later are established such that the third impurity layers 113 are each arranged at least between the first impurity layers 111, that the impurity layers 113 are each in contact with at least the side surface 112W of the corresponding second impurity layer 112 and with the main surface 110S of the semiconductor substrate, and that the third impurity layers 113 each have an impurity concentration higher than that of the semiconductor substrate 110. Further, in order to form the plurality of second and third impurity layers 112 and 113 into their respective configurations as described, it is preferable to synthetically establish conditions for ion implantation and annealing with respect to both layers 112 and 113.

In the implantation step, P-type dopants for forming the third impurity layers 113 may be implanted by ion implantation into the main surface 110S in a tilted direction relative to a direction normal to the main surface 110S of the semiconductor substrate 110 as shown in FIG. 22. More particularly, while rotating the semiconductor substrate 110 in a continuous or stepwise manner, ion beam including P-type dopants is emitted in a tilted direction relative to the normal to the main surface 110S of the semiconductor substrate 110. Alternatively, P-type dopants may be implanted by ion implantation from a plurality of directions using a plurality of ion beams each emitted in a tilted direction relative to the normal to the main surface 110S. According to such tilted ion implantation, dopants for forming the third impurity layer 113 are implanted into a region under the insulating film 120 and in the vicinity of the contact hole 120H. As a result, the third impurity layer 113 is allowed to contact the side surface 112W of the second impurity layer 112 with higher reliability.

Figure 19:
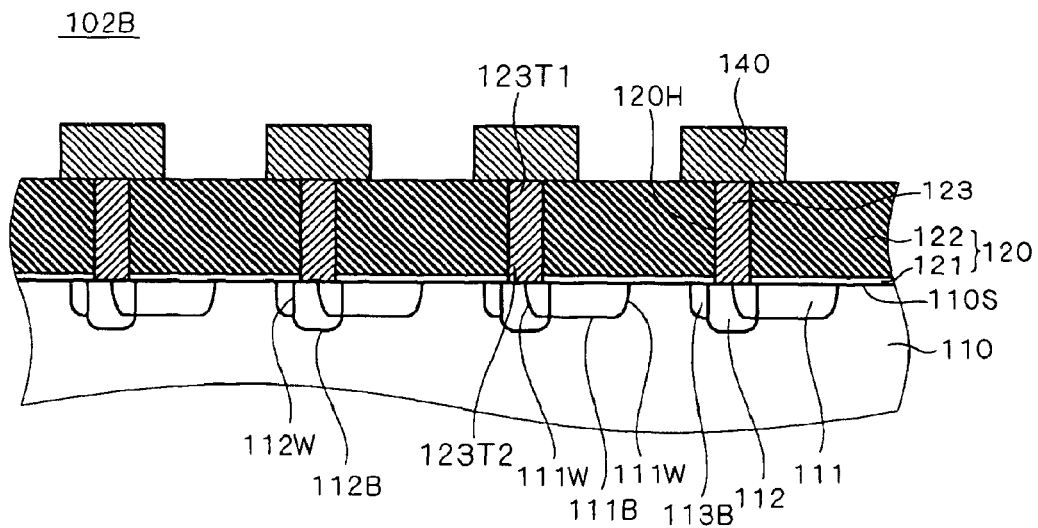
FIG. 19 is a sectional view illustrating a modification of the semiconductor device according to the second preferred embodiment of the present invention.

By controlling acceleration energy, for example, the third impurity layer 113B having a smaller depth than that of the third impurity layer 113 may be formed as shown in FIG. 19.

Thereafter, following the same steps of the manufacturing method according to the first preferred embodiment, the semiconductor devices 102 and 102B are completed.

Both steps of ion implantation for forming the second and third impurity layers 112 and 113 are required to be performed after the step of forming the contact hole 120H and prior to the step of forming the contact plug 123. Contrary to the order given above, ion implantation for forming the third impurity layer 113 may be performed first.

Third Preferred Embodiment

Figure 23:
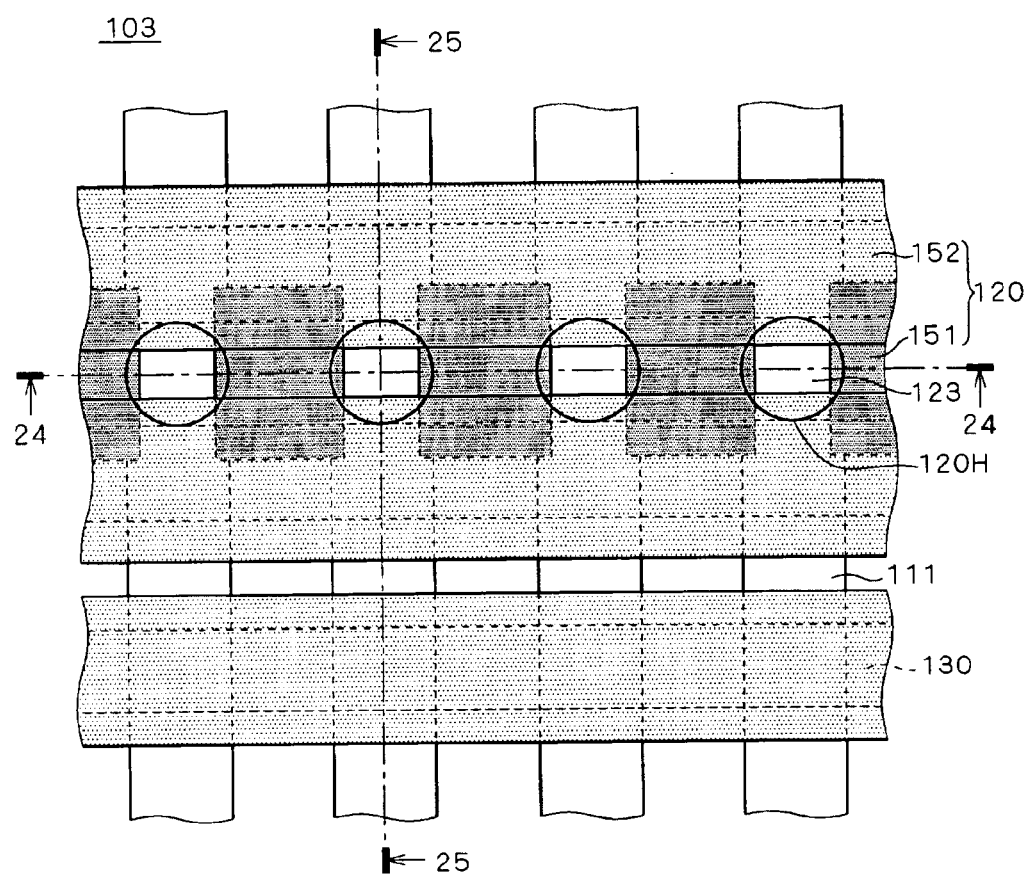
FIG. 23 is a plan view illustrating a semiconductor device according to a third preferred embodiment of the present invention.
Figure 24:
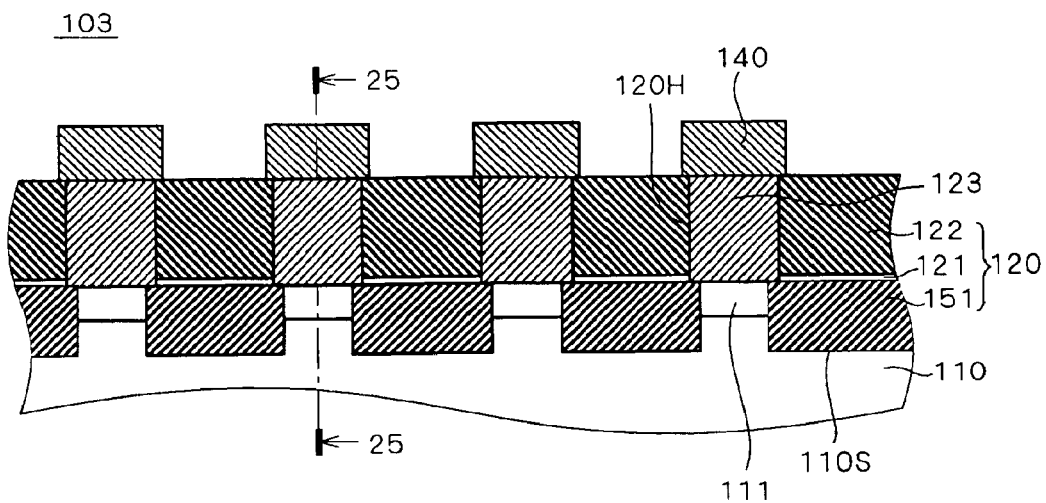
FIGS. 24 and 25 are sectional views illustrating the semiconductor device according to the third preferred embodiment of the present invention.
Figure 25:
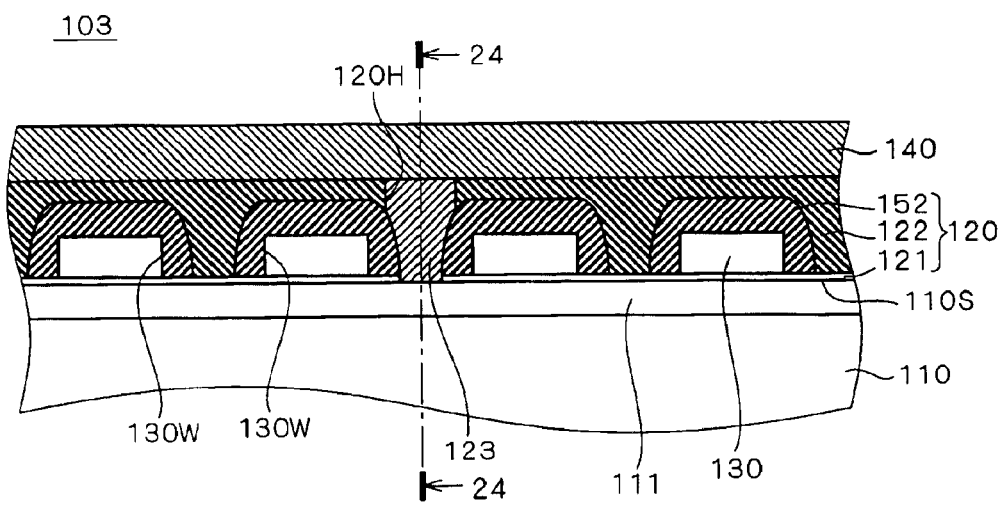

FIG. 23 is a plan view (layout) illustrating a semiconductor device or semiconductor memory device 103 according to the third preferred embodiment of the present invention. FIGS. 24 and 25 are sectional views taken along cutting lines 24—24 and 25—25 in FIG. 23, respectively.

The basic differences in configuration from the foregoing semiconductor device 101 are that the semiconductor device 103 does not include second impurity layer 112, and the semiconductor device 103 has a plurality of first insulating films 151 and a plurality of second insulating films 152. As an example, the first insulating film 151 is a silicon oxide film and the second insulating film 152 is a silicon nitride film. The insulating film 120 of the semiconductor device 103 includes (at least one) gate insulating film 121, the interlayer insulating film 122, the plurality of first insulating films 151, and the plurality of second insulating films 152.

More particularly, the plurality of first insulating films 151 are each interposed between adjacent first impurity layers 111 and defined in the vicinity of each one of the plurality of contact holes 120H, namely, each one of the plurality of contact plugs 123. The first insulating films 151 adjacent to each other holds the first impurity layer 111 defined therebetween. Further, the first insulating film 151 and the first impurity layer 111 are in contact with each other. The first insulating films 151 are each provided in a depression of the main surface 110S of the semiconductor substrate 110. The first impurity layers 111 are each provided in a projection of the main surface 110S. The structure as described is thereby obtained (see FIG. 24). According to this structure, the P-type region of the semiconductor substrate 110 does not exist between the N-type first impurity layer 111 and the first insulating film 151. Contrary to the structure given in FIG. 23, the plurality of first insulating films 151 may form stripes extending in the same direction as that of the first impurity layers 111. In the semiconductor device 103, further, the gate insulating film 121 is provided (extending) on the first insulating films 151.

Turning now to the plurality of second insulating films 152, the second insulating films 152 each cover the corresponding one of the plurality of gate electrodes 130 from the side of the low-resistance wires 140, contacting this gate electrode 130. In the semiconductor device 103, the interlayer insulating film 122 covers the plurality of second insulating films 152 and the plurality of gate electrodes 130 from the side of the low-resistance wires 140, and face the gate electrodes 130 through the second insulating films 152.

In FIG. 23, the plurality of first insulating films 151 and the plurality of second insulating films 152 are shown to be exposed in the plurality of contact holes 120H. In this case, each contact plug 123, defined between adjacent gate electrodes 130, is in contact with the low-resistance wire 140 and the first impurity layer 111 for forming a pair together. Each contact plug 123 further touches the first and second insulating films 151 and 152. Further, each contact plug 123 is interposed between adjacent gate electrodes 130.

Figure 28:
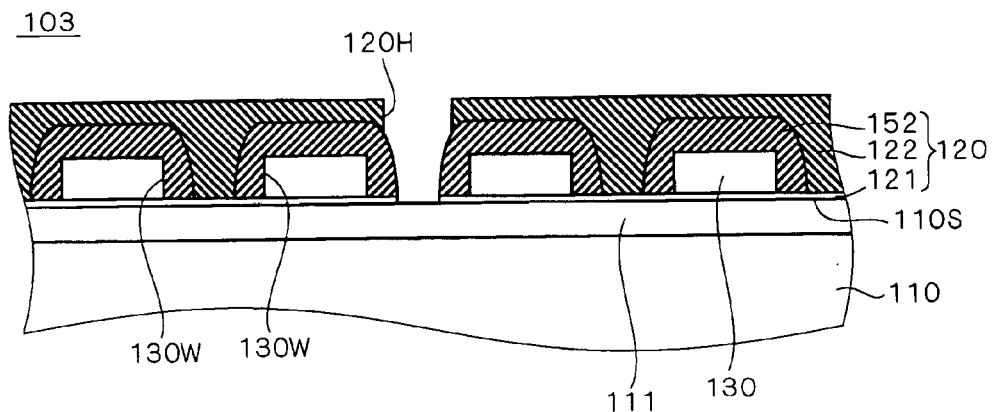

Next, with further reference to the sectional views of FIGS. 26 through 28, the method of manufacturing the semiconductor device 103 will be described.

First, following a process such as LOCOS insulation or trench isolation, the plurality of first insulating films 151 including silicon oxide are provided, for example. Thereafter following the same manufacturing method as in the first preferred embodiment, the plurality of first impurity layers 111 are provided (see FIG. 26). The order of forming the first insulating films 151 and the first impurity layers 111 may be arbitrary determined. However, the manner of forming the first insulating films 151 and the first impurity layers 111 should be such that the plurality of first insulating films 151 are each arranged between adjacent ones first impurity layers 111 for holding each one of the first impurity layers 111 therebetween.

Next, similar to the first preferred embodiment, the gate insulating film 121 and the plurality of gate electrodes 130 are provided.

Thereafter the plurality of gate electrodes 130 are entirely covered with a silicon nitride film, for example. This silicon nitride film is then etched back, to form the plurality of second insulating films 152 covering the gate electrodes 130 (see FIG. 27). At this time, etch back should be performed to an extent that the second insulating film 152 remains at least between adjacent gate electrodes 130.

Next, similar to the first preferred embodiment, the interlayer insulating film 122 that may be a silicon oxide film is provided to cover the gate electrodes 130 through the second insulating films 152. The interlayer insulating film 122 and the gate insulating film 121 are etched (namely, the insulating film 120 is etched) in the vicinity of the first and second insulating films 151 and 152. The contact hole 120H is thereby formed (see FIG. 28).

Resulting from the difference in material as described between the second insulating film 152 and the interlayer insulating film 122, the second insulating film 152 is less likely to be etched than the interlayer insulating film 122. In view of this, by selectively etching the interlayer insulating film 122 relative to the second insulating film 152, the contact hole 120H can be formed in a self-aligned manner (this technique is a so-called self-aligned contact (SAC) etching).

Thereafter following the same manufacturing method as in the first preferred embodiment, constituent elements such as contact plug 123 are provided. The semiconductor device 103 is thus completed.

In the semiconductor device 103, the first impurity layer 111 is interposed between the first insulating films 151. Therefore, there exits no P-type region of the semiconductor substrate 110 between the N-type first impurity layer 111 and the first insulating film 151. As a result, even when the contact hole 120H deviates from its proper position in a direction along which the first impurity layers 111 are arranged, electrical contact between the contact plug 123 and the P-type region of the semiconductor substrate 110 is reliably prevented by the presence of the first insulating film 151. Further, a part of each second insulating film 152 is arranged between adjacent gate electrodes 130 for holding the contact plug 123 therebetween. Therefore, even when the contact plug 123 deviates from its proper position along an extending direction of the first impurity layer 111, electrical contact between the contact plug 123 and the gate electrode 130 is reliably prevented by the presence of the second insulating film 152.

As described, by the presence of the first and second insulating films 151 and 152, it is allowed to ensure electrical connection between the first impurity layer 111 and the low-resistance wire 140 for forming a pair without the problem resulting from the contact of the contact plug 123 with the P-type region of the semiconductor substrate 110 and with the gate electrode 130. As a result, resistance in the fist impurity layer 111 for forming a signal line (bit line) is reduced by the low-resistance wire 140, allowing speedup of the semiconductor device 103. At the same time, by eliminating the foregoing problem, stable and reliable operations of the semiconductor device 103 are ensured. By eliminating the problem and ensuring electrical connection as described, the semiconductor device 103 further advantageously reduces alignment margin for the first impurity layer 111 and the contact hole 120H as compared with the background-art semiconductor device 901B, leading to reduction in layout area and eventually, leading to shrinkage of the semiconductor device 103. That is, according to the semiconductor device 103, speedup and shrinkage are simultaneously promoted.

As described, in the semiconductor device 103, SAC etching may be used for forming the contact hole 120H. The semiconductor device 103 is thus suitably applied for shrinkage. In the semiconductor device 103, as long as the second insulating film 152 is provided at least on a side surface 130W of the gate electrode 130 (as long as the second insulating film 152 is formed into a sidewall-like shape), SAC etching is applicable and the contact of the contact plug 123 with the side surface 130W is avoided. However, it requires no emphasis to say that the second insulating film 152 covering an upper surface of the gate electrode 130 as well as the side surface 130W of the same as in the semiconductor device 103 is more preferable.

Further, the semiconductor device 103 includes no second impurity layer 112. Therefore, when the first impurity layers 111 are equally spaced between the semiconductor devices 101 and 103, punch-through is less likely in the semiconductor device 103 than in the semiconductor device 101. That is, from this point of view, the semiconductor device 103 is more suitably applied for shrinkage than the semiconductor device 101. Further, instead of the first insulating film 151, the semiconductor device 103 may alternatively include second impurity layer 112, or second and third impurity layers 112 and 113.

Exemplary Applications of First Through Third Preferred Embodiments

The unit cell in the foregoing semiconductor device 101 may be a diode formed by providing an electrical short circuit between the drain and gate. The operations of the unit cell having a diode structure thus formed will be described with reference to FIGS. 29 and 30.

Figure 29:
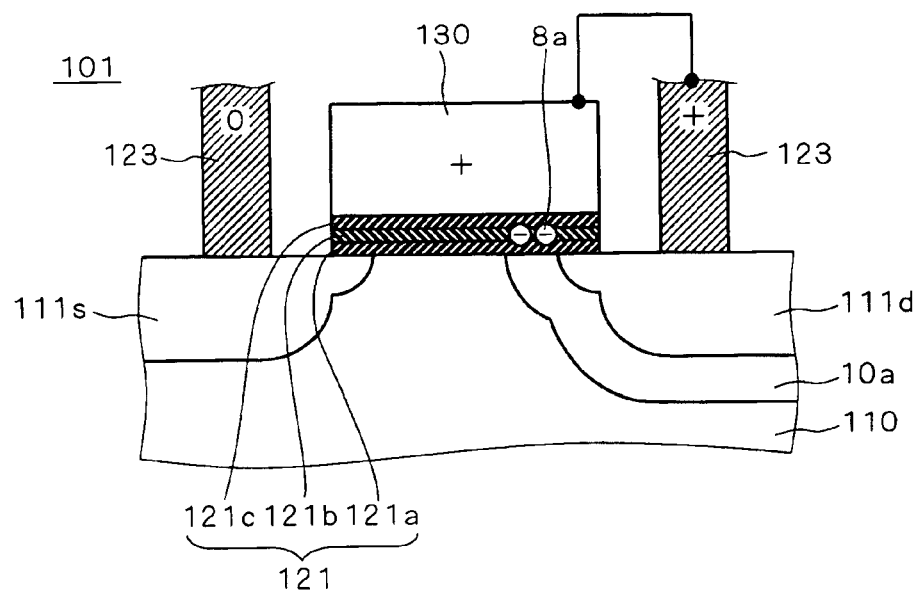
FIGS. 29 and 30 are sectional views each illustrating an exemplary application of the semiconductor device according to the first, second and third preferred embodiments of the present invention.

First, as given in FIG. 29, a short circuit is provided between the drain and gate and a forward bias voltage is applied across the drain and source. The unit cell is thereby brought into the same condition as in the unit cell given in FIG. 12 including the depletion layer 10a. Due to the formation of the depletion layer 10a, the induced in-channel charges 9a disappear.

As the gate and drain are short circuited, an N-type channel is formed in the channel-forming region of the semiconductor substrate 110, allowing a drain-source current to flow. The in-channel charges 9a are cancelled out by the depletion layer 10a and therefore, they cause no effect on the formation of the N-type channel.

Figure 30:
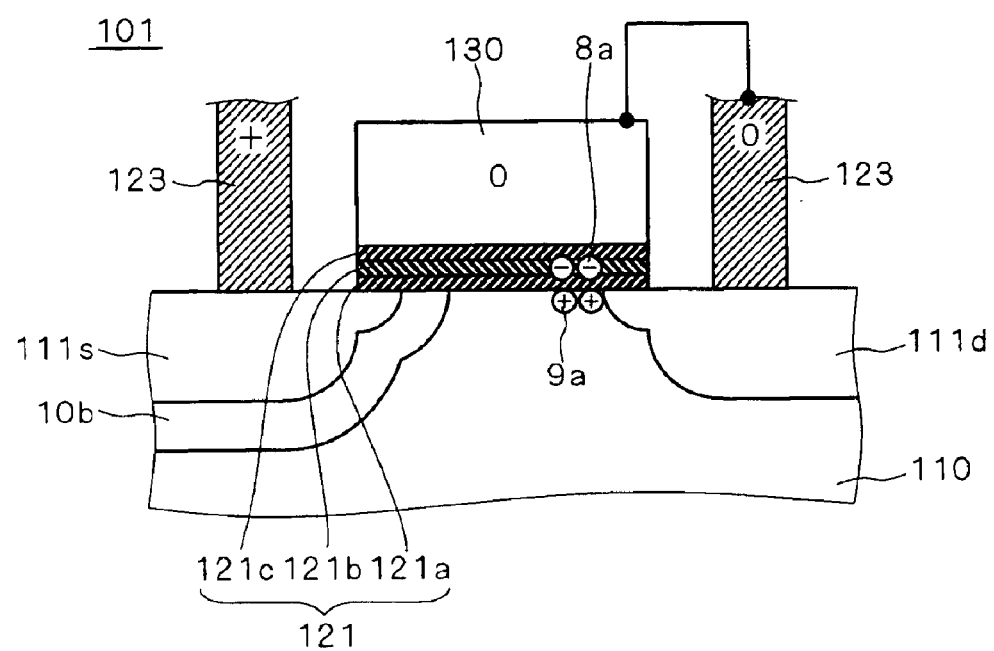
Figure 31:
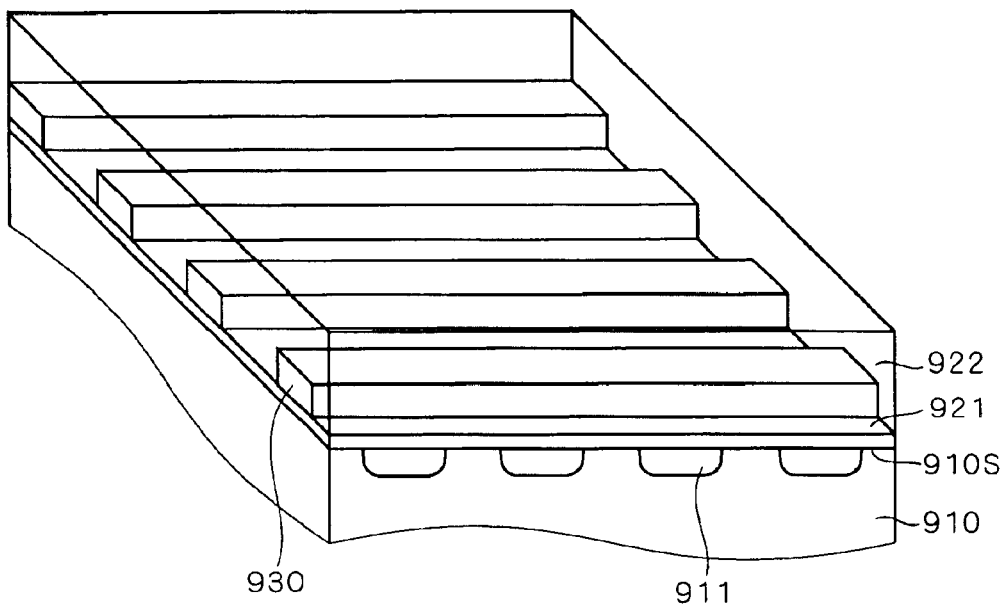
FIG. 31 is a perspective view illustrating the semiconductor device according to the first background art.
Figure 32:
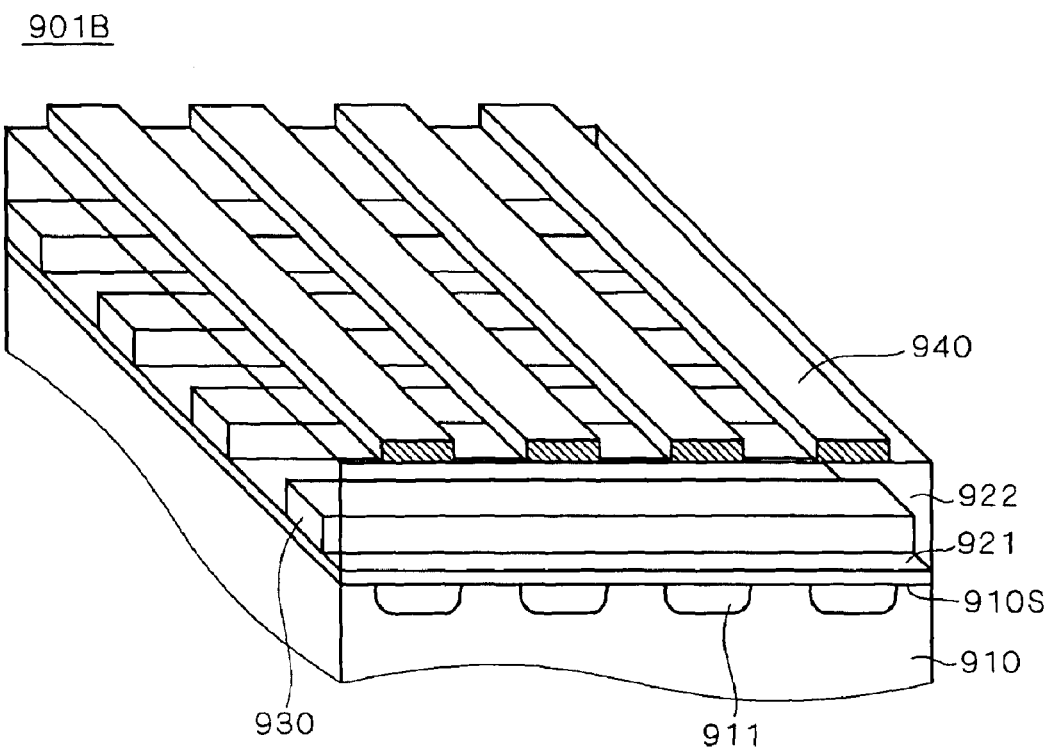
FIG. 32 is a perspective view illustrating the semiconductor device according to the second background art.
Figure 33:
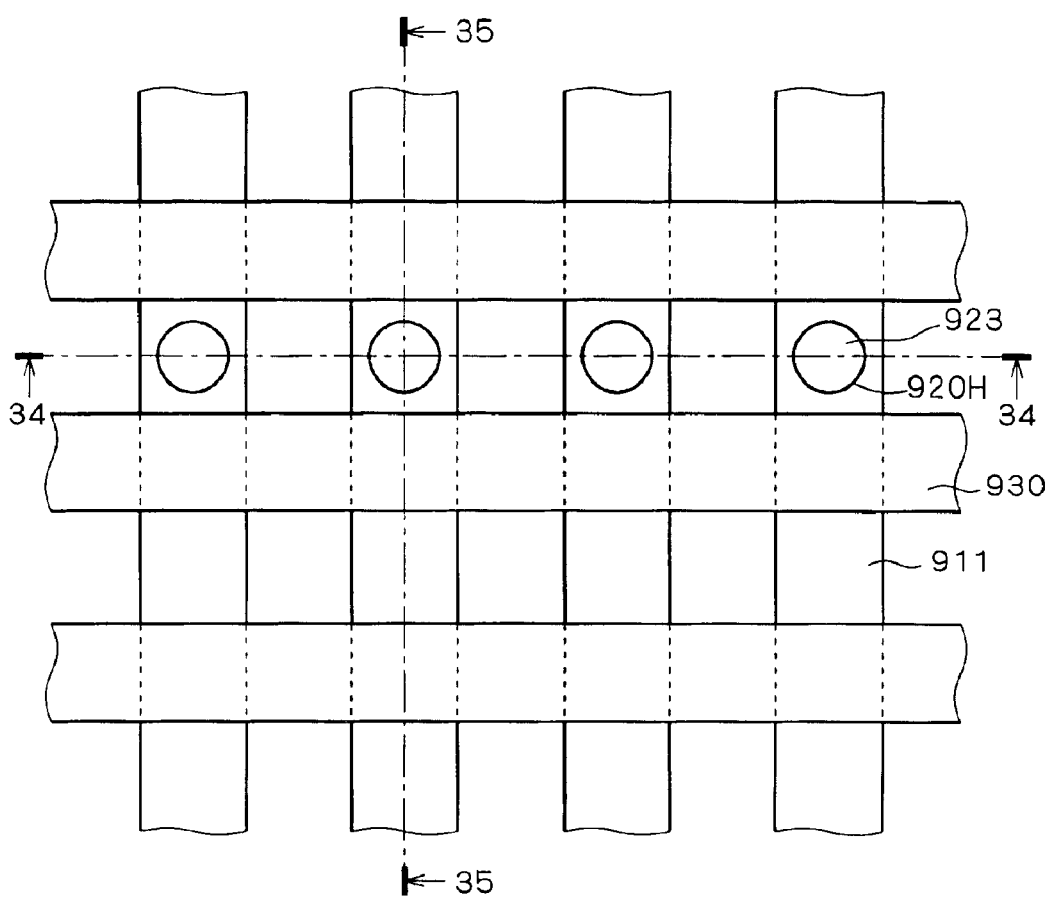
FIG. 33 is a plan view illustrating the semiconductor device according to the second background art.
Figure 34:
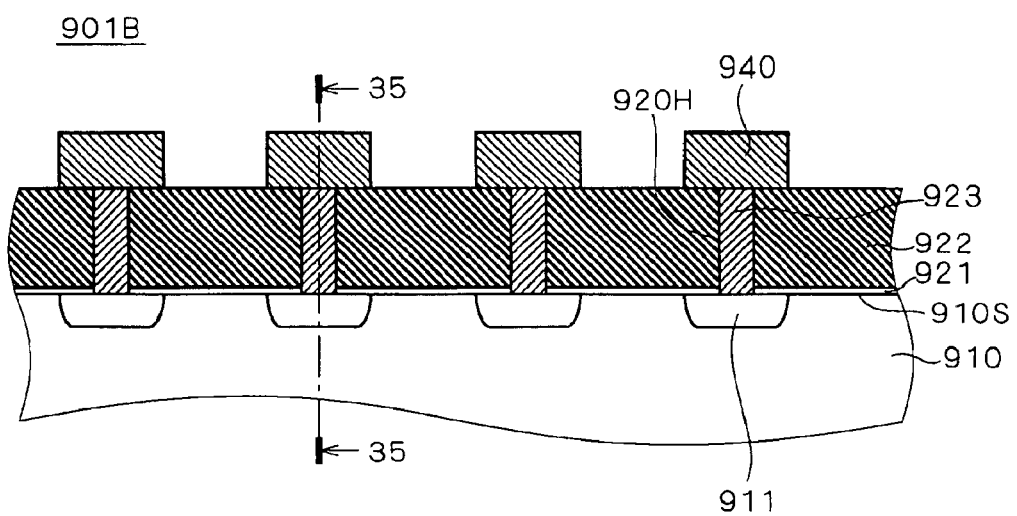
FIGS. 34 and 35 are sectional views illustrating the semiconductor device according to the second background art.
Figure 35:
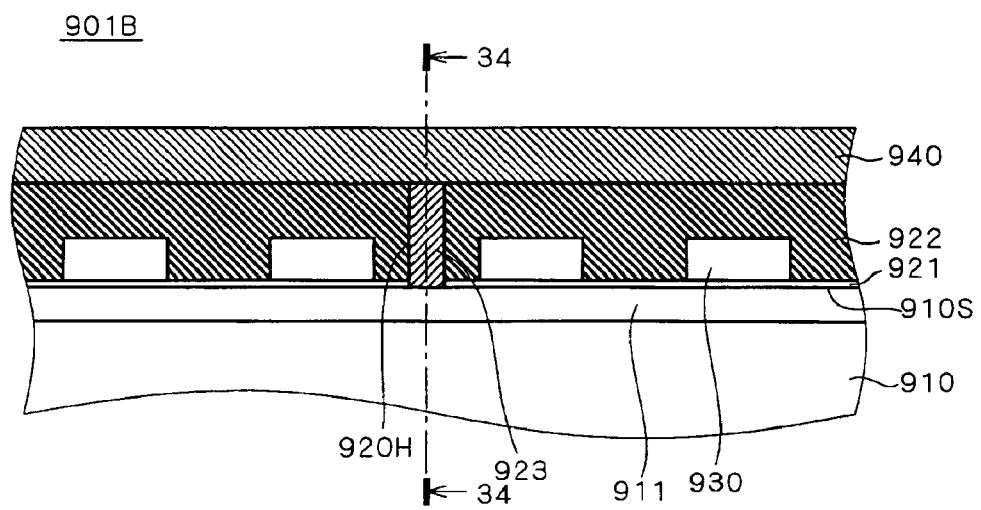

On the other hand, as given in FIG. 30, a short circuit is provided between the drain and gate and a reverse bias voltage is applied across the drain and source. The gate is shorted with the drain and therefore, it becomes the same in potential as the drain. Further, the source bears potential higher than that of the drain.

At this time, the depletion layer 10a is not formed at the PN junction between the drain region 111d and the semiconductor substrate 110. Therefore, the induced in-channel charges 9a still remain. Further, there is no potential difference between the gate and drain, producing no accumulation of charges in the gate insulating film 121. Electric field of the in-channel charges 9a is not lowered accordingly.

That is, the in-channel charges 9a remain in the same state as in the unit cell receiving no voltage given in FIG. 11. The N-type channel thus fails to reach the drain region 111d, ranging to a lesser extent than in FIG. 13. The source-drain current is thereby less likely to flow.

A threshold value of the diode is controllable by the amount of the negative charges 8a trapped in the gate insulating film 121. Using the variation in threshold value (the amount of the in-film charges 8a), data (information) can be accumulated in each unit cell. The exemplary applications described so far may be further applicable to the others such as semiconductor device 101B.

In a transistor of a MOS structure (FET), it is a conventional technique widely used of providing a short circuit between the drain and gate to form a diode. However, a threshold value cannot be controlled in a diode that is formed from a MOSFET. That is, a semiconductor memory device including a unit cell having a MOSFET cannot be applied in the foregoing examples.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a semiconductor substrate of a first conductivity type having a main surface;
   a plurality of first impurity layers of a second conductivity type different from said first conductivity type, said plurality of first impurity layers forming stripes in said main surface;
   an insulating film arranged on said main surface;
   a plurality of gate electrodes, said plurality of gate electrodes forming stripes in said insulating film crossing said plurality of first impurity layers;
   a plurality of low-resistance wires lower in resistance than said plurality of first impurity layers, said plurality of low-resistance wires forming stripes on said insulating film extending in the same direction as that of said plurality of first impurity layers, said plurality of low-resistance wires each forming a pair with one of said plurality of first impurity layers;
   a plurality of contact plugs provided in said insulating film and arranged between adjacent ones of said plurality of gate electrodes, at least one of said plurality of contact plugs being provided to one of said low-resistance wires, each contact plug having one end contacting a corresponding one of said plurality of low-resistance wires and another end extending toward said main surface;
   a plurality of second impurity layers of said second conductivity type, said plurality of second impurity layers each being arranged in said main surface to correspond to one of said plurality of contact plugs, wherein
   said plurality of second impurity layers each, only in a part thereof, touch or overlap one of said plurality of first impurity layers, which forms a pair with one of said plurality of low-resistance wires having contact with a contact plug corresponding to one of said plurality of second impurity layers, and
   said another end of said each contact plug entirely and directly touches said one of said plurality of second impurity layers and said each contact plug is composed of a metal.

2. The semiconductor device according to claim 1, further comprising:
   a plurality of third impurity layers of said first conductivity type higher in impurity concentration than said semiconductor substrate, wherein
   said plurality of third impurity layers are each arranged at least between said plurality of first impurity layers to correspond to one of said plurality of second impurity layers, and
   said plurality of third impurity layers are each in contact with at least a side surface of said one of said plurality of second impurity layers.

3. The semiconductor device according to claim 2, wherein
   said plurality of third impurity layers are each in contact with said side surface and a bottom surface of said one of said plurality of second impurity layers.

* * * * *